United States Patent
Mabuchi et al.

(10) Patent No.: US 7,564,079 B2
(45) Date of Patent: Jul. 21, 2009

(54) SOLID STATE IMAGER DEVICE WITH LEAKAGE CURRENT INHIBITING REGION

(75) Inventors: Keiji Mabuchi, Kanagawa (JP); Nobuhiro Karasawa, Kanagawa (JP)

(73) Assignee: Sony Corporation (JP)

( * ) Notice: Subject to any disclaimer, the term of this patent is extended or adjusted under 35 U.S.C. 154(b) by 620 days.

(21) Appl. No.: 11/354,921

(22) Filed: Feb. 16, 2006

(65) Prior Publication Data

US 2006/0187327 A1    Aug. 24, 2006

(30) Foreign Application Priority Data

Feb. 21, 2005 (JP) ............... 2005-043357
Dec. 20, 2005 (JP) ............... 2005-366916

(51) Int. Cl.
H04N 5/335 (2006.01)
H04N 5/21 (2006.01)

(52) U.S. Cl. ............... 257/229; 257/225; 257/231; 257/431; 257/459; 348/241; 348/243; 348/308

(58) Field of Classification Search ............... 348/308, 348/294, 241–244; 257/225–234, 431–466
See application file for complete search history.

(56) References Cited

U.S. PATENT DOCUMENTS

| | | | | |
|---|---|---|---|---|
| 5,327,004 A | * | 7/1994 | Kurusu et al. | 257/435 |
| 5,416,345 A | * | 5/1995 | Matsunaga | 257/222 |
| 5,656,835 A | * | 8/1997 | Komobuchi | 257/232 |
| 6,297,532 B1 | * | 10/2001 | Yamamoto et al. | 257/333 |
| 6,521,920 B2 | * | 2/2003 | Abe | 257/223 |
| 6,606,124 B1 | * | 8/2003 | Hatano et al. | 348/311 |
| 6,833,601 B2 | * | 12/2004 | Murakami | 257/437 |
| 2003/0173582 A1 | * | 9/2003 | Hatano et al. | 257/184 |
| 2003/0214595 A1 | * | 11/2003 | Mabuchi | 348/294 |
| 2003/0235044 A1 | * | 12/2003 | Amir | 361/767 |
| 2005/0006677 A1 | * | 1/2005 | Roy | 257/290 |

FOREIGN PATENT DOCUMENTS

JP    2003-031785    1/2003
JP    2003-338615    11/2003

* cited by examiner

*Primary Examiner*—Sinh Tran
*Assistant Examiner*—Mark Monk
(74) *Attorney, Agent, or Firm*—Rader Fishman & Grauer PLLC; Ronald P. Kananen

(57) ABSTRACT

In a case when a structure of forming a p+ layer on a substrate rear surface side is employed in order to prevent dark current generation from the silicon boundary surface, various problems occur. According to this invention, an insulation film 39 is provided on a rear surface on a silicon substrate 31 and a transparent electrode 40 is further provided thereon, and by applying a negative voltage with respect to the potential of the silicon substrate 31 from a voltage supply source 41 to the insulation film 39 through the transparent electrode 40, positive holes are accumulated on a silicon boundary surface of the substrate rear surface side and a structure equivalent to a state in which a positive hole accumulation layer exists on aforesaid silicon boundary surface is to be created. Thus, various problems in the related art can be avoided.

4 Claims, 15 Drawing Sheets

SOLID STATE IMAGER DEVICE WITH LEAKAGE CURRENT INHIBITING REGION

CROSS REFERENCES TO RELATED APPLICATIONS

The present invention contains subject manner related to Japanese Patent Application JP 2005-043357 filed in the Japanese Patent Office on Feb. 21, 2005, and Japanese Patent Application JP 2005-366916 filed in the Japanese Patent Office on Dec. 20, 2005, the entire contents of which being incorporated herein by reference.

BACKGROUND OF THE INVENTION

1. Field of the Invention

The present invention relates to a solid-state imager device and a drive method of a solid-state imager device and more particularly, it relates to a rear surface incidence type solid-state imager device which takes in incident light from the rear surface side of the substrate (from the opposite side of the wiring forming side), a drive method of that solid-state imager device and a camera apparatus thereof.

2. Description of the Related Art

In a solid-state imager device, for example, in an X-Y address type solid-state imager device represented by a CMOS imager sensor, a pixel structure of a rear-surface light receiving type is employed for the purpose of attempting miniaturization and high aperture ratio realization of pixels in which a wiring layer is formed on one surface (front surface) of a semiconductor substrate and incident light is taken in from the surface (rear surface) side on the opposite side of that wiring layer (for example, see Patent Document 1 or 2).

The pixel structure according to a related art described in the Patent Document 1 has a constitution, as shown in FIG. 1, in which a wiring layer 103 arranged with multi-layer wirings 106 through interlayer insulation films is formed on one surface (hereinafter, there is also a case of simply being described as the "substrate front surface") side of a silicon layer (substrate) 101 on which a photodiode 102 is formed and visible light is to be taken in from the other surface of the silicon layer 101 side and, more specifically, from the surface on the opposite side of the wiring layer 103 (hereinafter, there is also a case of simply being described as "substrate rear surface") side. A p type well region 107 which reaches the substrate rear surface is formed on the periphery of the photodiode 102. In the rear surface incidence type CMOS imager sensor, a p+ layer 104 is formed on the substrate rear surface side in order to prevent generation of a negative current from the silicon boundary surface. Next there are two kinds of methods as methods of fabricating the p+ layer 104.

The first method is a method in which the wiring layer 103 containing a transistor and a wiring is formed on the substrate front surface side and thereafter, the substrate is turned over and an electron injection preventing layer 105, such as a silicon oxide film (SiO2) or the like, is formed after polishing or the like is applied with respect to the substrate rear surface side, and thereafter the p+ layer 104 is formed by ion injection.

The second method is a method in which the p+ layer 104 is formed in a deep region of the substrate by high energy ion injection from the substrate front surface side on the way of a process for fabricating a transistor on the substrate front surface side, subsequently the wiring 106 is fabricated so as to form the wiring layer 103, and thereafter the substrate is turned over, polishing or the like is applied until the position of the p+ layer 104 and a light receiving surface is formed on the substrate rear surface side.

The pixel structure according to a related art described in the Patent Document 2 has a constitution, as shown in FIG. 2, in which a wiring layer 203 arranged with multi-layer wirings 207 through interlayer insulation films is formed on one surface (front surface) side of a silicon portion (high resistance substrate) 201 on which a photodiode 202 is formed, the photodiode 202 and a p type well region 204 of its periphery are arranged as a layer structure without reaching the substrate rear surface in a rear surface incidence type CMOS imager sensor which takes in light from the other surface (rear surface) side and at the same time, a transparent electrode 206 formed on the substrate rear surface through an electron injection preventing film 205 is applied with negative voltage.

[Patent Document 1] Laid-open Patent Publication No. 2003-031785

[Patent Document 2] Laid-open Patent Publication No. 2003-338615

In the related art described in the above mentioned Patent Document 1, the p+ layer 104 is formed on the substrate rear surface side in order to prevent the generation of a negative current from the silicon boundary surface, so that there is a problem as explained herein below, even in a case when aforesaid first method is employed for forming the aforesaid p+ layer 104, or even in a case when the aforesaid second method is employed.

(Case of Employing the First Method)

A negative current decreasing effect cannot be exercised at the maximum unless heat treatment for activation is applied with respect to the ion injected p+ layer 104, but the ion injection is carried out in a process after the wiring forming, so that the wiring is melted if the heat treatment is carried out by an ordinary diffusion furnace or the like, and therefore it cannot be employed.

Consequently, largeness of the negative current is tolerated without heat treatment for activation or the heat treatment is carried out by laser annealing or the like only for a shallow region on the substrate rear surface side. However, the apparatus for laser annealing is expensive and slow because it scans wafers sequentially, when compared with a diffusion furnace, which can handle dozens of wafers all at once. Furthermore, with laser annealing lines of scanning may appear non-uniform, in an imaged picture.

(Case of Employing the Second Method)

The ion injection is carried out before the wiring layer 103, so that the heat treatment for activation is possible, but the ion injection is carried out in a deep region by high energy, so that the distribution of the p+ layer 104 is to spread. When the distribution of the p+ layer 104 spreads the probability of catching photoelectrons in a shallow region on the substrate rear side surface lowers. This is due to the reduced probability of catching photoelectrons from the blue light.

This lowering in blue sensitivity wipes out the effect in which there is no sensitivity lowering by vignetting of the wiring 106, which is a feature of the pixel structure of the rear-surface light receiving type. On the other hand, the light sensitivity of a red color which approaches a deep region increases directly as much as the vignetting of the wiring 106 which disappears owing to the rear surface incidence. The blue sensitivity becomes relatively bad along with the sensitivity improvement of the red color, so that the balance of the spectral diffraction collapses.

On the other hand, in the related art described in the Patent Document 2, a constitution in which a negative voltage is applied to the transparent electrode 206 and an electric field in the depth direction is generated in the substrate is employed in order to induce photoelectrons entered from the substrate rear surface to the photodiode 202 properly even in a case when a layer structure in which the p type well region 204 does not reach the substrate rear surface is employed and it was not considered with respect to lowering the dark current from the silicon boundary surface of the substrate rear surface side.

SUMMARY OF THE INVENTION

The present invention is invented in view of the aforesaid problems and is directed to propose a solid-state imager device, a drive method of a solid-state imager device and a camera apparatus in which it is possible to lower the generation of a dark current from the boundary surface of the substrate rear surface side without carrying out ion injection to the substrate rear surface side, condensing the density or applying a heat treatment for activation.

A solid-state imager device relating to the present invention has a feature in a solid-state imager device constituted to have a wiring layer on a first surface (substrate front surface) side of a semiconductor substrate on which pixels including photoelectric conversion elements are formed and to take in incident light from a second surface (substrate rear surface) side which is the opposite side with respect to the wiring layer, with an insulation film formed on the second surface of the semiconductor substrate and voltage applying means for applying a voltage of reverse-polarity with respect to the potential of the semiconductor substrate to the insulation film are provided.

According to a solid-state imager device and a camera apparatus of the present invention, when a voltage of reverse-polarity (a negative voltage when the semiconductor substrate is a n type and positive voltage when it is a p type) with respect to the potential of the semiconductor substrate is applied to the insulation film in a solid-state imager device of a rear surface incidence type which takes in incident light from the substrate rear surface side, positive holes are accumulated on the semiconductor boundary surface (the boundary surface with the insulation film) of the substrate rear surface side when, for example, the semiconductor substrate is a n type (electrons when it is a p type) and it becomes equivalent to a state in which a positive hole accumulation layer (or electron accumulation layer) exists on the boundary surface of the substrate rear surface side. Then, according to the operation of the portion in which the positive holes (or electrons) are accumulated, generation of electrons (or positive holes) from the boundary surface of the substrate rear surface side, which is a dominant reason for the negative current generation, decreases.

A solid-state imager device and a camera apparatus relating to the present invention have a feature in which pixels including photoelectric conversion elements are formed on a semiconductor substrate, an insulation film is formed on the rear surface side of the semiconductor substrate, incident light is made to be taken in from a rear surface side of the semiconductor substrate, a rear surface electrode is formed through the insulation film in the pixel array portion, and a leakage current inhibiting region for inhibiting a leakage current between the pad portion and the semiconductor substrate is provided just under a pad portion of the rear surface electrode.

In a solid-state imager device and a camera apparatus of the present invention, generation of a dark current from the boundary surface of the substrate rear surface side decreases by applying a voltage of reverse-polarity with respect to the potential of the semiconductor substrate to the rear surface electrode, as mentioned above. Further, a leakage current inhibiting region can be provided just under the pad portion, so that even if a needle for inspection is applied to the pad portion many times, insulation film destruction under the rear surface electrode can be prevented, or even if the insulation film is destroyed, it is possible to inhibit the leakage current between the pad portion and the semiconductor substrate.

According to a solid-state imager device and a camera apparatus relating to the present invention, it is possible to fabricate a structure equivalent to a positive hole accumulation layer (or an electron accumulation layer) on the boundary surface of the substrate rear surface side by forming an insulation film on the rear surface of the semiconductor substrate and by applying a voltage of reverse-polarity with respect to the potential of the semiconductor substrate to the insulation film, so that it is possible to lower the generation of a dark current from the boundary surface of the substrate rear surface side even without carrying out ion injection on the substrate rear surface side or applying heat treatment for activation.

According to a solid-state imager device and a camera apparatus relating to the present invention, it is possible to lower the generation of a dark current from the aforesaid boundary surface of the substrate rear surface side, and, in addition, it is possible to inhibit the generation of a leakage current between the pad portion and the semiconductor substrate by a leakage current inhibiting region just under the pad portion, so that it is possible to thin the thickness of the insulation film under the rear surface electrode.

DESCRIPTION OF THE PREFERRED EMBODIMENTS

Hereinafter, the present invention will be explained in detail with respect to exemplified embodiments with reference to drawings.

Figure 3:
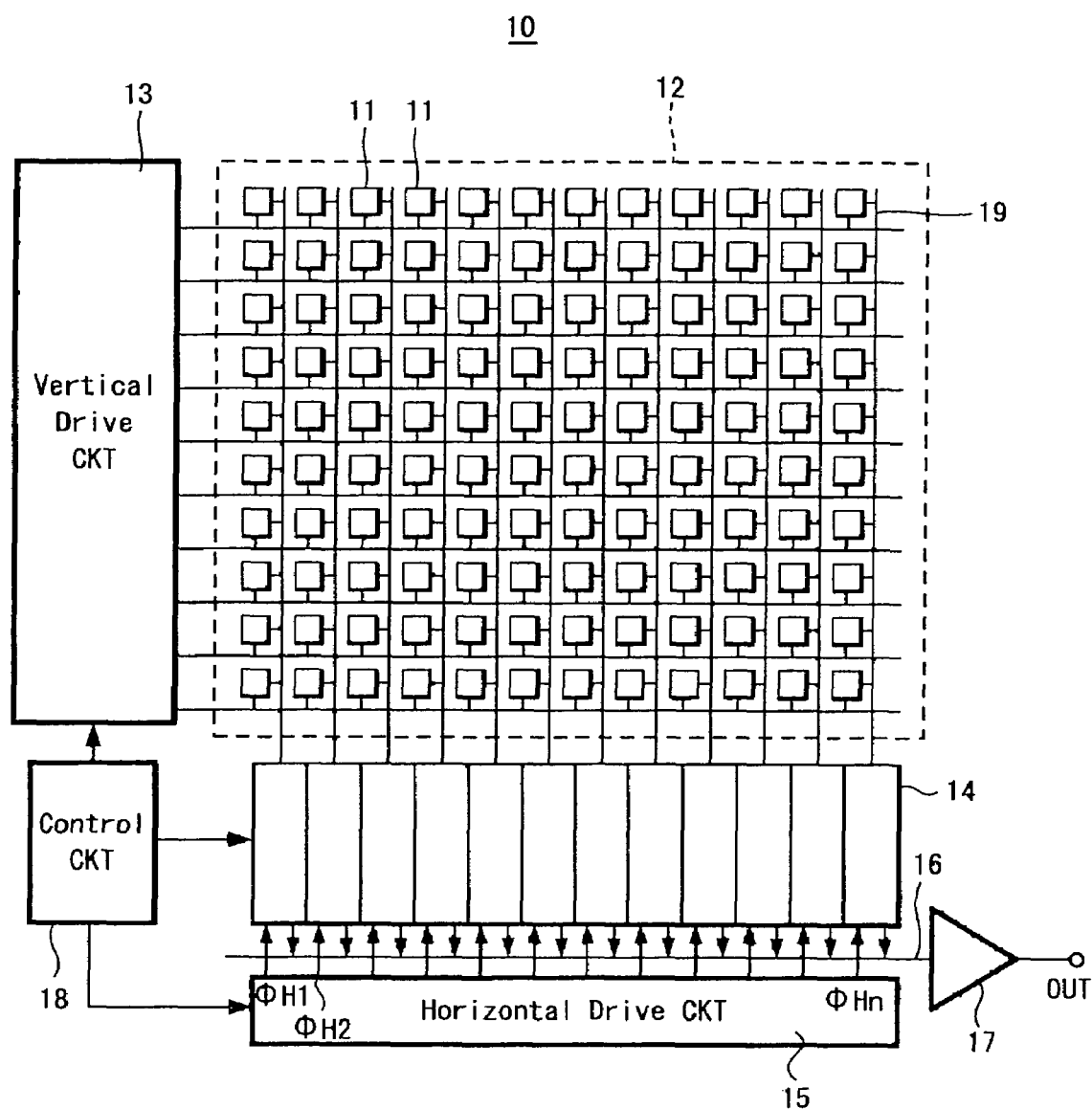
FIG. 3 is a block diagram showing a constitution of the whole CMOS imager sensor to which the present invention is applied.

FIG. 3 is a block diagram showing the whole constitution of a solid-state imager device, for example, a CMOS imager sensor, to which the present invention is applied. It should be noted that the present invention will be explained here by citing examples in a case of being applied to a solid-state imager device of a CMOS type, but the present invention is not limited by these application examples, and it is possible to apply it similarly with respect to all aspects of X-Y address system solid-state imager devices, such as MOS type solid-state imager devices or the like.

As shown in FIG. 3, a CMOS imager sensor 10 relating to this application example has a system constitution in which there are provided a pixel array portion 12 constituted by many pixels 11 including photoelectric conversion elements arranged two dimensionally in line-column form (matrix form), a vertical drive circuit 13, a column signal processing circuit 14, a horizontal drive circuit 15, a horizontal signal line 16, an output circuit 17 and a control circuit 18.

In this system constitution, the control circuit 18 externally receives data instructing an operation mode of this CMOS imager sensor 10 or the like, exteriorly outputs data including information of this CMOS imager sensor 10 and, at the same time, produces a clock signal which becomes an operational reference of the vertical drive circuit 13, the column signal processing circuit 14 and the horizontal drive circuit 15 and the like, a control signal and the like based on a vertical synchronizing signal Vsync, a horizontal synchronizing signal Hsync and a master clock MCK and applies them with respect to the vertical drive circuit 13, the column signal processing circuit 14, the horizontal drive circuit 15 and the like.

In the pixel array portion 12, the pixels 11 are arranged two dimensionally, and, at the same time, line control lines are wired for respective pixel lines with respect to the pixel arrangement in a lateral direction (right and left direction) of the drawing and vertical signal lines 19 are wired for respective pixel columns in a longitudinal direction (up and down direction) of the drawing. The vertical drive circuit 13 is constituted by a shift register or the like, scans each pixel 11 of the pixel array portion 12 per each line sequentially and selectively and supplies a necessary control pulse with respect to each of the pixels of the selection line by way of the aforesaid line control line.

The signal outputted from each pixel of the selection line is supplied to the column signal processing circuit 14 by way of the vertical signal line 19. The column signal processing circuit 14 is arranged, for example, at every pixel column of the pixel array portion 12 and when receiving the signal outputted from the pixels 11 for one line for every pixel column, a signal process, such as CDS (Correlated Double Sampling), for removing a fixed pattern noise specific to the pixel 11, signal amplification and the like is carried out with respect to that signal.

Figure 4:
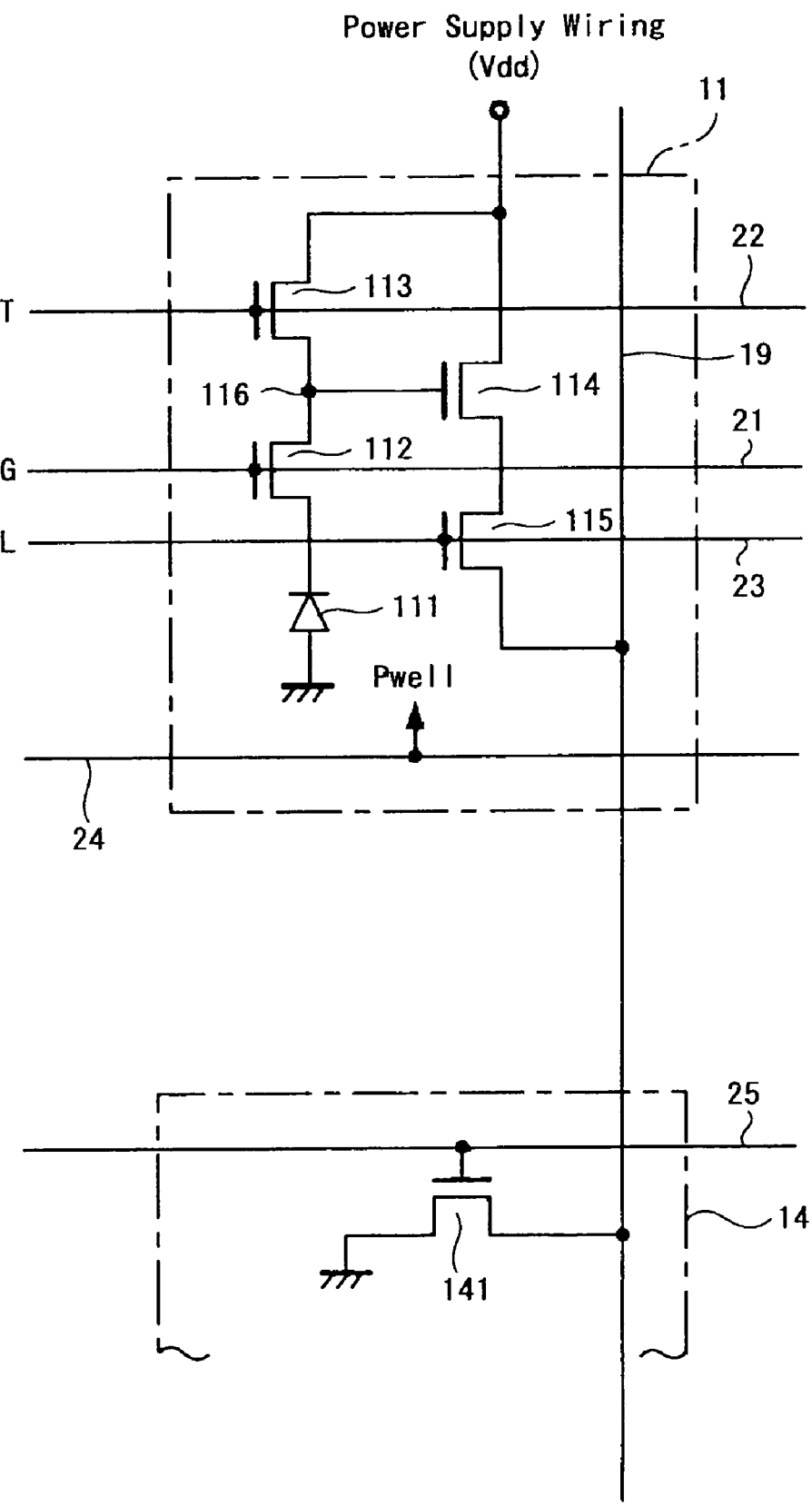
FIG. 4 is a circuit diagram showing one example of a circuit constitution of a pixel.

The input stage of the column signal processing circuit 14 is provided, as shown in FIG. 4, with a load transistor 141 as a constant current source. The load transistor 141 is connected between the vertical signal line 19 and a reference potential, for example, the ground, and the gate thereof is connected to a load wiring 25, and by constituting a source follower circuit together with a pixel amplifier transistor 114 of a selection line, a signal is outputted from the pixel of the selection line to the vertical signal line 19.

The output stage of the column signal processing circuit 14 is provided with a horizontal selection switch (not shown) that is connected between the horizontal signal line 16 and there. It should be noted that it is also possible to employ a constitution in which an A/D (analog/digital) conversion function is possessed by the column signal processing circuit 14.

The horizontal drive circuit 15 is constituted by a shift register or the like, selects each of the column signal processing circuits 14 in a sequential order by outputting horizontal scanning pulses φH1 to φHn sequentially and makes each of the column signal processing circuits 14 output a pixel signal to the horizontal signal line 16.

The output circuit 17 applies various signal processes with respect to the signals supplied from the respective column signal processing circuits 14 sequentially by way of the horizontal signal line 16 and outputs them. As for the concrete signal process in the output circuit 17, there is, for example, a case in which only buffering is carried out, or there is also a case in which black level adjustment, fluctuation correction for each column, signal amplification, color related processing or the like is carried out before the buffering.

FIG. 4 is circuit diagram showing one example of a circuit constitution of the pixel 11. As shown in FIG. 4, the pixel 11 relating to this circuit example is constituted as a pixel circuit such that there are provided, for example, four transistors i.e., a transfer transistor 112, a reset transistor 113, an amplifier transistor 114 and a selection transistor 115 in addition to a photoelectric conversion element, for example, a photodiode 111. Here, for the transistors 112 to 115, for example, N channel MOS transistors are used.

The photodiode 111 photoelectric converts the received light to a light charge (here, electron) having an amount of charge in response to that amount of light. The cathode (n type region) of the photodiode 111 is connected with the gate of the amplifier transistor 114 through the transfer transistor 112. A node 116 connected to the gate of this amplifier transistor 114 electrically is referred to as a FD (floating diffusion) portion.

The transfer transistor 112 is connected between the cathode of the photodiode 111 and the FD portion 116, becomes an ON state by being applied with a transfer pulse φTRG to the gate thereof through the transfer line 21 and transfers the light charge photoelectric converted by the photodiode 111 to the FD portion 116.

With respect to the reset transistor 113, the drain thereof is connected to a pixel power supply Vdd and the source thereof is connected to the FD portion 116 respectively, and by applying a reset pulse φRST to the gate thereof through the reset line 22, it becomes the ON state and by throwing away the charge of the FD portion 116 to the pixel power supply Vdd in advance of a signal charge transfer from the photodiode 111 to the FD portion 116, it makes the aforesaid FD portion 116 reset.

With respect to the amplifier transistor 114, the gate thereof is connected to the FD portion 116 and the drain thereof is connected to the pixel power supply Vdd respectively, and it outputs the potential of the FD portion 116 after being reset by the reset transistor 113 as a reset level, and further, it outputs the potential of the FD portion 116 after the signal charge is transferred by the transfer transistor 112 as a signal level.

With respect to the selection transistor 115, for example, the drain thereof is connected to the source of the amplifier transistor 114 and the source thereof is connected to the vertical signal line 19 respectively, and by applying a selection pulse φSEL to the gate thereof through the selection line 23, it becomes the ON state and it makes the pixel 11 be a selection state and relays a signal outputted from the amplifier transistor 114 to the vertical signal line 19.

With respect to the wirings in the lateral direction, that is, the transfer line 21, the reset line 22 and the selection line 23, they are made to be common for the pixels of the same line and are controlled by the vertical drive circuit 13. However, the p well wiring 24 for fixing the p well potential of the pixel 11 is fixed to the ground potential.

It should be noted with respect to the selection transistor 115 that it is also possible to employ a circuit constitution in which the transistor is connected between the pixel power supply Vdd and the drain of the amplifier transistor 114.

Also, as for the pixel 11, it is not limited by the four transistor constitution of the aforesaid constitution, and it may be possible to employ even a three transistor constitution in which the amplifier transistor 114 and the selection transistor 115 are used compatibly.

In the pixel 11 of the aforesaid constitution, a pixel structure of a rear-surface light receiving type (rear surface incidence type) is employed for the purpose of attempting miniaturization and high aperture ratio making of the pixel such that a wiring layer is formed on the first surface (substrate front surface) of the semiconductor substrate and incident light is taken in from the second surface (substrate rear surface) side on the opposite side of the aforesaid wiring layer. Concrete constitutions of the pixel structure of this rear-surface light receiving type are features of the present invention. Further, in addition to the pixel structure of the rear-surface light receiving type, the structure in the pad portion for the bonding that is formed on the substrate rear surface side is also a feature of the present invention. It will be explained herein below with respect to concrete exemplified embodiments of the present invention.

First Exemplified Embodiment

Figure 5:
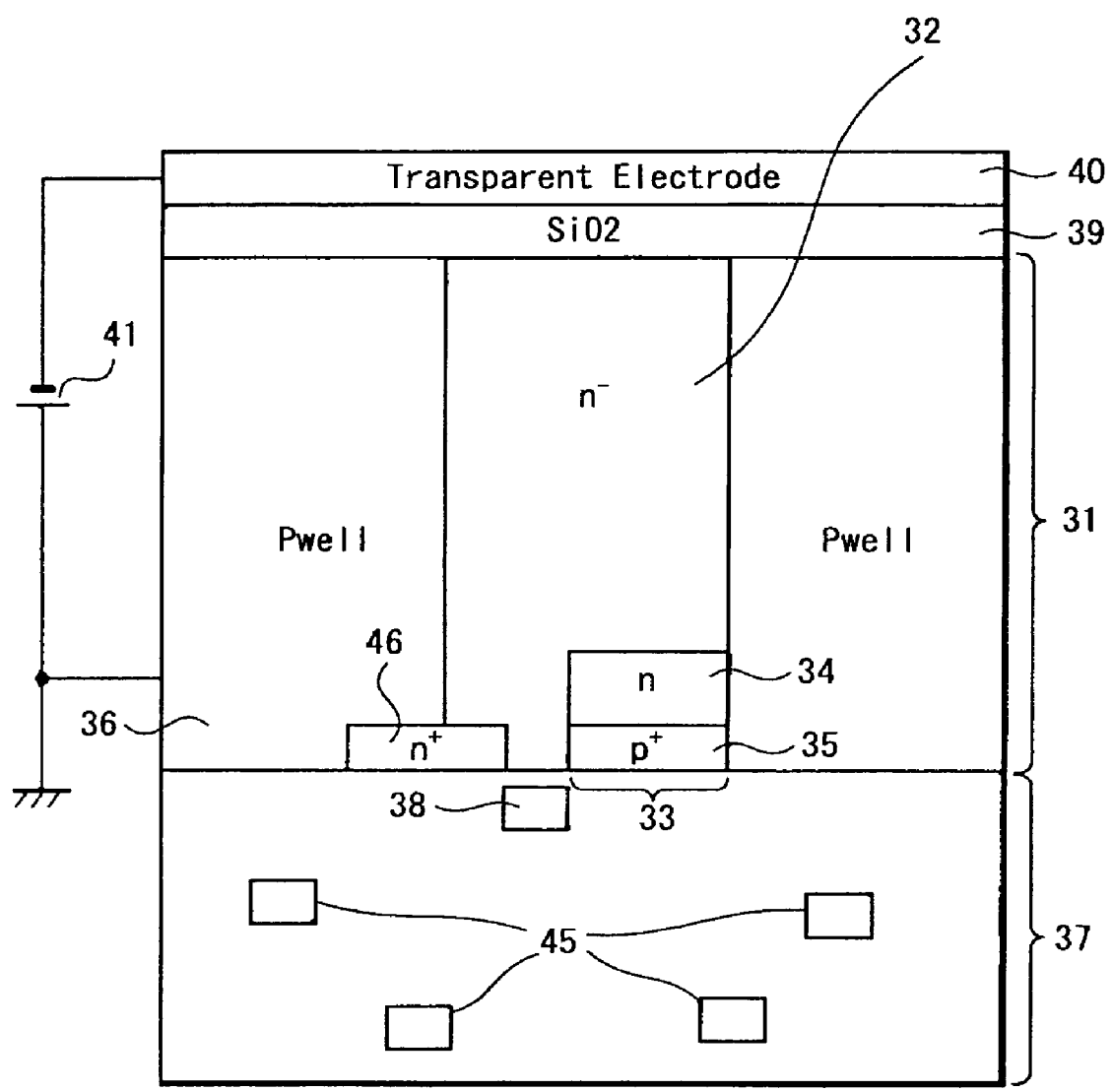
FIG. 5 is a cross section diagram showing a solid-state imager device relating to a first exemplified embodiment of the present invention and particularly showing a main portion of its pixel structure of a rear-surface light receiving type.

FIG. 5 is a cross section diagram showing a main portion of a CMOS imager sensor of a rear surface incidence type and, more particularly the pixel structure of the rear-surface light receiving type relating to a first exemplified embodiment of the present invention. In the pixel structure of the rear-surface light receiving type relating to this exemplified embodiment, a first conductivity type, for example, a n type (n-) silicon substrate is used as the semiconductor substrate.

In FIG. 5, by polishing a wafer using CMP (Chemical Mechanical Polishing), a predetermined thickness of a silicon portion (hereinafter, described as "silicon substrate") 31 is formed and a photodiode 33 (corresponding to photodiode 111 of FIG. 4) is formed in this silicon substrate 31 by utilizing the aforesaid substrate (n-type region 32). It is preferable for the thickness of the silicon substrate 31 to be around 5 μm to 10 μm with respect to visible light. According to the thickness setting, it is possible to photoelectrically convert the visible light favorably by the photodiode 32.

The photodiode 33 has a n-type region 32 which becomes a photoelectric conversion region and includes a n type region 34 which accumulates light charge (electron in this example) that was photoelectrically converted by the n-type region 32; and further, it is a buried diode (HAD; Hole Accumulated Diode) that is provided with a p+ layer 35 accumulating carriers on the silicon boundary surface of the substrate front surface (first surface) side, that is, positive holes in this example, and is formed such that it reaches the rear surface (second surface) of the silicon substrate 31 together with its peripheral p type semiconductor well region (hereinafter, referred to as a p type well region) 36.

On the front surface side of the silicon substrate 31, there is formed a wiring layer wired with various kinds of wirings of the pixel 11, that is, specifically, the transfer line 21 previously mentioned, the reset line 22, the selection line 23, the p well wiring 24 and the like, and more specifically, a wiring layer 37 containing a multi-layer wiring 45 through interlayer insulation films. It happens in this wiring layer 37 that starting with the gate electrode 38 of the transfer transistor 112, the gate electrodes of other transistors (not shown) are formed.

The p well region 36 is formed, as mentioned above, so as to reach the rear surface of the silicon substrate 31 and, at the same time, is applied with a reference potential, for example, the ground (GND) potential by way of the wiring layer 37, that is, specifically, the p well wiring 24. In FIG. 5, there is shown only a transfer transistor as a MOS transistor. The transfer transistor is formed such that the photodiode 33, in particular, a n type region 34 is made to be the source thereof, and it includes an n type source-drain region 46, which becomes a FD portion, and the gate electrode 38 is formed through a gate insulation film.

In this manner, by forming the periphery of the photodiode 33 so as to reach the substrate rear surface and by surrounding it with the p well region 36 applied with a reference potential, it is possible to induce the photoelectrically converted light charge to the n type region 34 properly in a region close to the substrate rear surface.

There is formed an insulation film 39 on the rear surface of the silicon substrate 31. This insulation film 39 has, for example, a one-layer structure of a silicon oxide film (SiO2). However, as for the insulation film 39, it is not limited by a one-layer structure of a silicon oxide film, and it may be possible to employ, for example, even a two-layer structure of a silicon oxide film and a silicon nitride film. By employing this two-layer structure, a reflection preventing effect owing to the silicon nitride film is obtained and it is possible to take in incident light more, so that there is the merit that sensitivity can be improved.

There is formed, on the insulation film 39, an electrode for applying, for example, a negative voltage (for example, around −3V) from the voltage supply source 41 to the insulation film 39, so-called a rear surface electrode. In the example shown in the drawing, a transparent electrode 40 consisting of ITO (oxide of indium and tin) is formed. This transparent electrode 40 and the voltage supply source 41 constitute a voltage applying means for applying a voltage of reverse-polarity with respect to the potential of the silicon substrate 31 (positive potential in this example), that is, a negative voltage to the insulation film 39.

It should be noted in this example that the transparent electrode 40 is to be used as an electrode for applying a voltage to the insulation film 39, but it is not always necessary to use the transparent electrode over the whole surface an electrode having a constitution which can take in incident light into the n-type region 32, such as an electrode of a constitution having one through hole in a region corresponding to the n-type region 32 in which at least the photoelectric conversion is carried out or having a plurality of through holes in the aforesaid region or the like, can be used.

As mentioned above, by providing the insulation film 39 on the rear surface of the silicon substrate 31 and at the same time by applying a voltage of reverse-polarity with respect to the potential of the silicon substrate 31 to the aforesaid insulation film 39, for example, around −3V voltage, positive holes are accumulated on the silicon boundary surface of the substrate rear surface side and it becomes equivalent to a state in which a positive hole accumulation layer exists on the aforesaid silicon boundary surface. At that time, the silicon substrate 31 and the transparent electrode 40 are insulated electrically by means of the insulation film 39, so that an electric field fundamentally in the p well region 36 which is not depleted is not formed. Then, according to the operation of the silicon boundary surface accumulated with the positive holes, electron generation from the silicon boundary surface on the substrate rear surface side, which is a dominant reason for generation of the dark current, will decrease.

The operation of the boundary surface portion accumulated with the positive holes (positive hole accumulation layer) is the same as the operation of the p+ layer 35 in the photodiode 33 of the buried diode constitution. The operation of the p+ layer 35 is described as follows. More specifically, free charges existing in the p+ layer 35 on the front surface of the photodiode 33 are only positive holes, and electrons become a depletion state. As a result, the silicon boundary surface is filled with positive holes and electron generation from the silicon boundary surface, which is the dominant generation reason of the dark current, will decrease significantly. According to the operation of the p+ layer 35, it can realize a photodiode having a few dark currents. This fact is similarly true also with respect to the substrate rear surface side.

In this manner, according to the first exemplified embodiment, it is possible to fabricate a structure equivalent to a positive hole accumulation layer on the silicon boundary surface of the substrate rear surface side by employing a constitution provided with such a rear surface electrode, so that it is possible to decrease the dark current generation from the boundary surface of the substrate rear surface side. In particular, the process, such as for ion injecting to the substrate rear surface side, for condensing the density or applying heat treatment for activation in the related art becomes unnecessary, so that the production process is very easy and it is possible to make the blue sensitivity the maximum since the distribution of the formed positive hole accumulation layer in the substrate depth direction is very shallow.

And now, it is important in the rear surface incidence type that the photoelectron generated on the substrate rear surface side will not be recombined with the positive hole until it comes to the front surface. In particular, in a case such as this example, when a potential difference equal to or more than the silicon band gap is not generated after the front surface until the rear surface of the photodiode 33, there is a limitation in the power for collecting electrons to the front surface, so that it becomes important to pull out positive holes generated by the photoelectric conversion rapidly.

Consequently, it is desirable to provide a contact for fixing the potential of the p well region 36 not only at the periphery of the pixel 11 but also at every one pixel or at one place for several pixels by way of the wiring passing through the pixel 11, specifically, by way of the p well wiring 24 (see FIG. 4). In this manner, when the positive holes become excessive in the p well region 36, it is possible to pull them out rapidly, so that it is possible to improve the sensitivity.

(Manufacturing Method)

Subsequently, the invention will be explained with respect to a process for producing a CMOS imager sensor of a pixel structure of a rear-surface light receiving type (rear surface incidence type) having the constitution mentioned above.

(1) The photodiode 33 and the p well region 36 are formed from the front surface side of the silicon substrate 31, and at the same time, transistors of the pixel 11 (transfer transistor 112, reset transistor 113, amplifier transistor 114 and selection transistor 115) are formed on the front surface side of the silicon substrate 31, and subsequently, gate electrodes of the transistors and the wiring layer 37 containing various kinds of wirings (transfer line 21, reset line 22, selection line 23, p well wiring 24 and the like) are formed.

(2) A supporting substrate is pasted and the wafer is turned over and polished such the rear surface side is formed with the thickness of the silicon substrate 31 of around 5 μm to 10 μm.

(3) According to LPCVD (low pressure chemical vapor deposition), the insulation film 39, specifically, a tetraethyl orthosilicate (TEOS) film which forms a silicon oxide film, is formed as much as around 20 nm to 40 nm by a low-temperature recipe of around 320.

(4) According to a sputtering method, an ITO film, which is the transparent electrode 40, is formed as much as around 50 nm to 100 nm.

According to the process mentioned above, it is possible to produce a pixel structure of a rear-surface light receiving type. Thereafter, if necessary, it is also possible to form another electrode for light shielding, a color filter or on-chip lenses on the transparent electrode 40.

However, the invention is not limited by the aforesaid manufacturing method as for the manufacturing method of the CMOS imager sensor of the pixel structure of the rear-surface light receiving type. For example, when the SOI substrate (substrate having a structure of silicon-oxide film) is used, it is possible to employ such a method to remove the oxide film and the substrate side silicon to form the rear surface side.

Alternatively, if a method is found in which silicon is to be oxidized thinly in a low temperature, around 300° C., by which the wiring 45 is not melted, it is also possible to form it by being oxidized according to that method in the process of the aforesaid (3). In addition, it is also possible in the process of (3) to make the insulation film 39 as a two-layer structure for reflection prevention by applying a silicon nitride film just after applying a silicon oxide film.

Second Exemplified Embodiment

In the first exemplified embodiment, it was assumed that around −3V voltage is applied to the insulation film 39 by using the transparent electrode 40 and the voltage supply source 41, but in the second exemplified embodiment, a transparent electrode is formed on the insulation film 39 by using a material possessing work function difference which applies substantially a negative voltage with respect to the silicon, and it is constituted such that the negative voltage of the work function difference of the transparent electrode and the negative voltage by the voltage supply source 41 are used together and are applied to the insulation film 39.

It should be noted that it is not always necessary for the transparent electrode consisting of a material possessing the work function difference which applies a negative voltage to be a transparent electrode beyond all over the whole surface, similarly as in the case of the first exemplified embodiment, and it is allowed only if it is an electrode of a constitution such as an electrode of a constitution provided with one through hole in the region corresponding to the n-type region 32 in which at least the photoelectric conversion is carried out or provided with a plurality of through holes in the aforesaid region wherein it is possible to take in incident light into the n-type region 32.

In this manner, by utilizing the work function difference for the transparent electrode and by using the material in which a negative voltage of the work function difference is supposed to applied substantially in a 0V state, it is possible to lower the voltage supply value of the voltage supply source 41 as much as the value of the aforesaid negative voltage.

As one example, by making the film thickness of insulation film 39, that is, the silicon oxide film in this example, to be equal to or more than 20 nm, and by forming a transparent electrode using a semiconductor of a conductivity type different from that of the silicon substrate 31, for example, a p type polysilicon of a thin film of around 30 nm, as a material possessing a work function difference which applies a negative voltage, it is possible to obtain around −0.5V as the negative voltage of the work function difference by the aforesaid transparent electrode, so that it is possible to lower the negative voltage value of the voltage supply source 41 to −2.5V.

Also, if the film thickness of the insulation film 39, that is, the silicon oxide film, is made to be a thin film of around several nano-meters, it is possible to accumulate positive holes on the silicon boundary surface by a voltage of only around −0.5V, so that it is possible to lower the negative voltage value of the voltage supply source 41 to 0V. This means that it needs not use the voltage supply source 41.

Since the polysilicon lowers the blue sensitivity, it is preferable to make the polysilicon (transparent electrode) a thin film as mentioned above in order to make its influence the minimum.

Third Exemplified Embodiment

Figure 6:
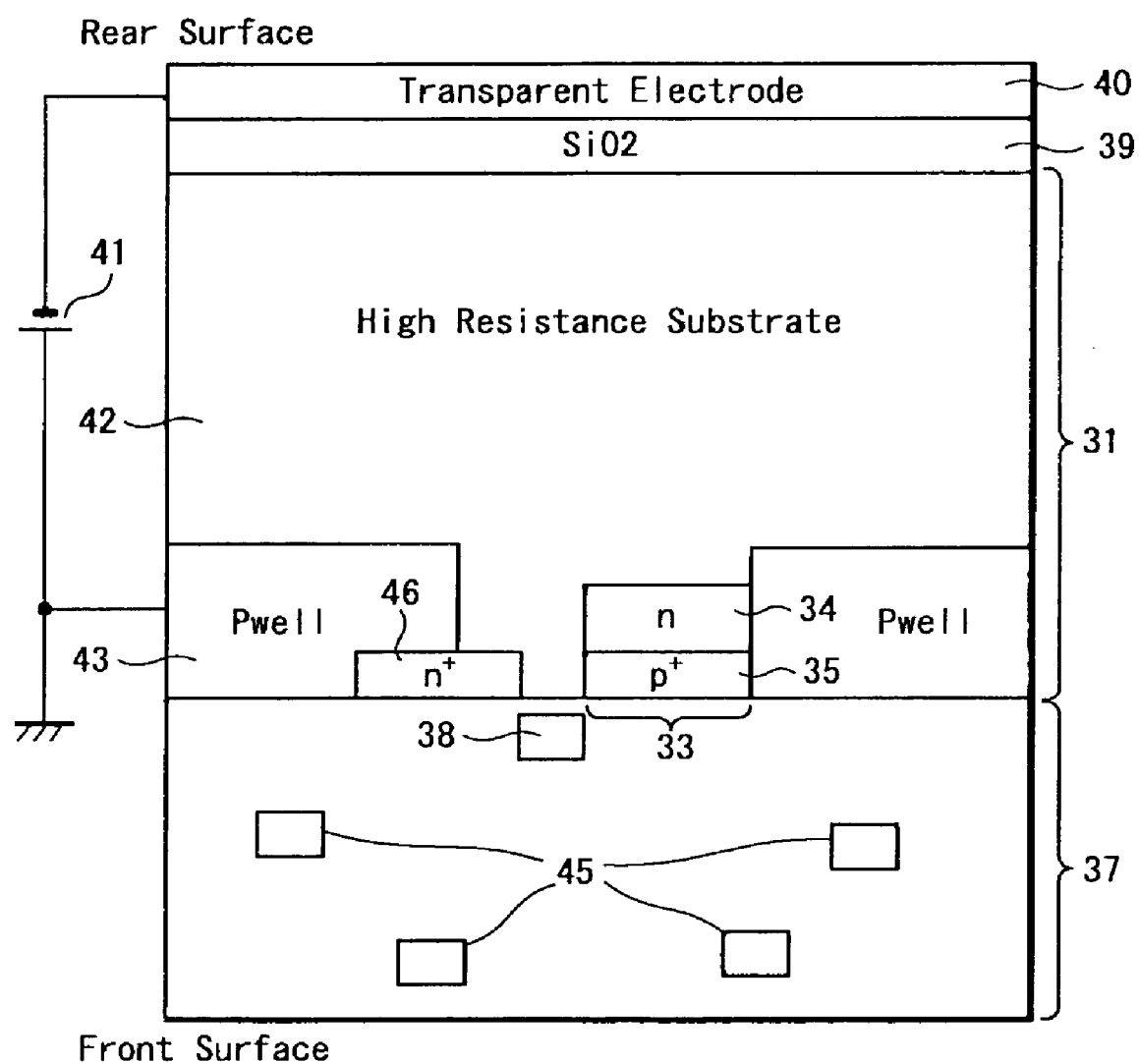
FIG. 6 is a cross section diagram showing a solid-state imager device relating to a third exemplified embodiment of the present invention and particularly showing a main portion its pixel structure of a rear-surface light receiving type.

FIG. 6 is a cross section diagram showing a main portion of a CMOS imager sensor of a rear surface incidence type, in particular, a pixel structure of the rear-surface light receiving type relating to a third exemplified embodiment of the present invention, wherein portions corresponding to those in FIG. 5 are shown in the drawing by putting the same reference numerals thereon.

In the pixel structure of the rear-surface light receiving type relating to the third exemplified embodiment, it is the same as the cases of the first and the second exemplified embodiments with respect to an aspect where a structure is employed in which the insulation film 39 is provided on the rear surface of the silicon substrate and at the same time, by applying the aforesaid insulation film 39 with a voltage of reverse-polarity with respect to that of the potential of the silicon substrate 31, for example, with a voltage of around −3V, positive holes are accumulated on the silicon boundary surface of the substrate rear surface side.

Figure 1:
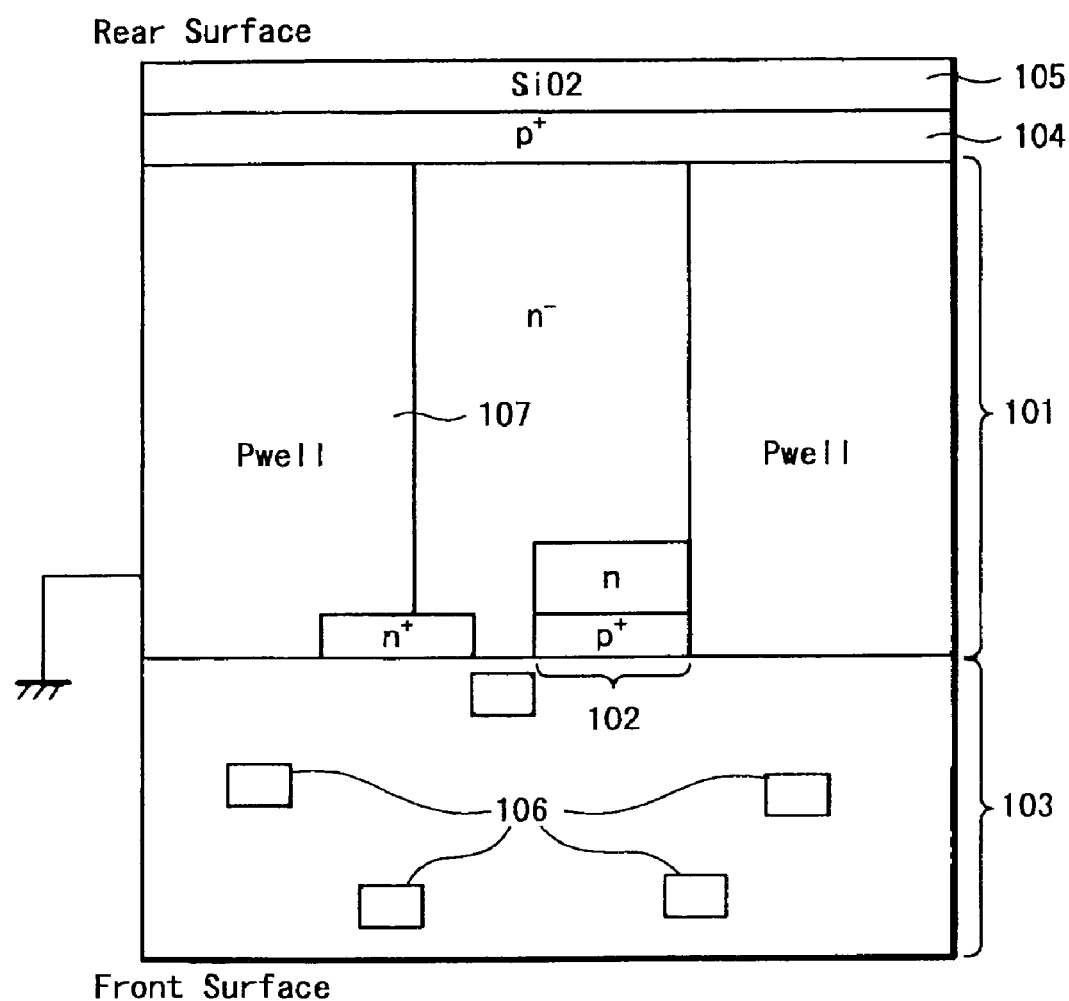
FIG. 1 is a cross section diagram showing one example of a pixel in a solid-state imager device of a past rear surface incidence type in the past.
Figure 2:
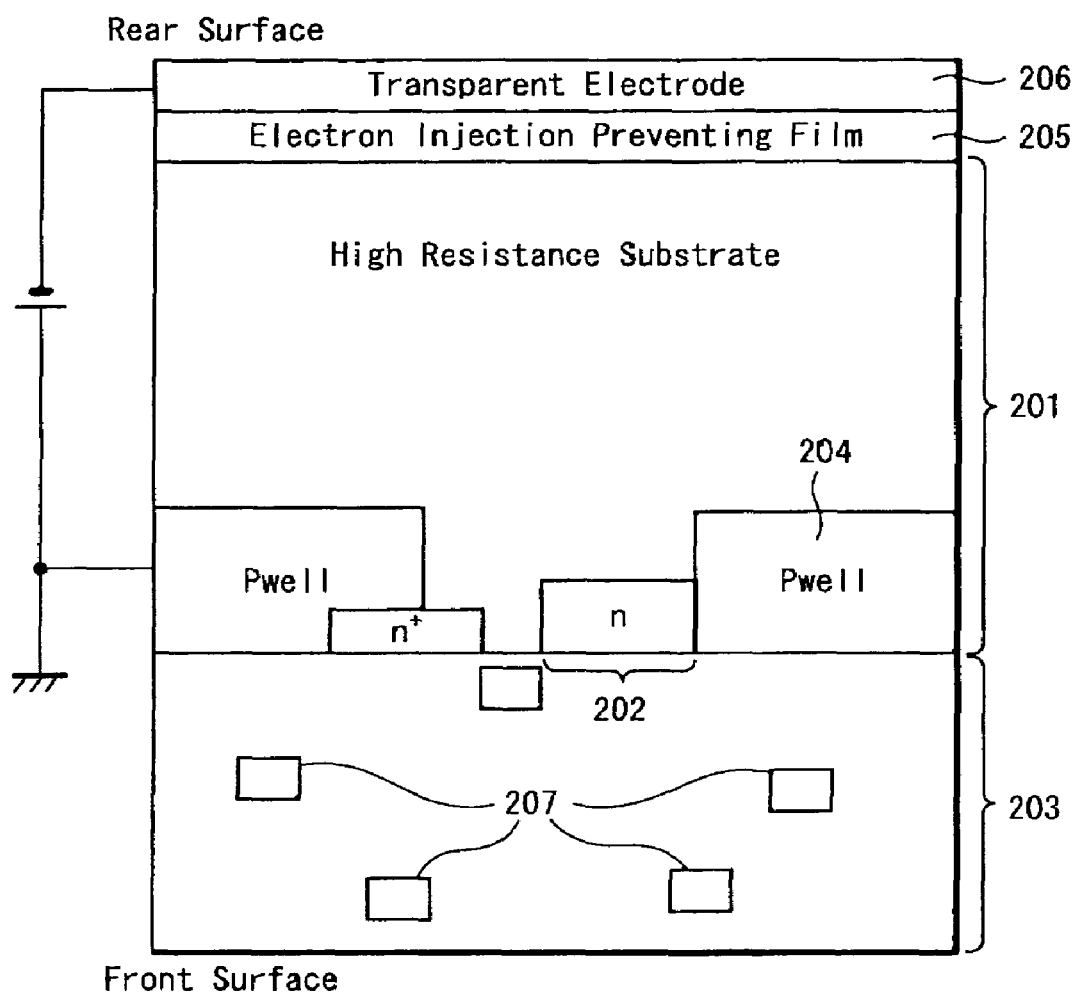
FIG. 2 is a cross section diagram showing another example of a pixel in a solid-state imager device of a rear surface incidence type.

An aspect different from those of the cases of the first and the second exemplified embodiments lies in that a high resistance substrate 42 close to an intrinsic semiconductor is used as the semiconductor substrate and the p well region 43 does not reach the substrate rear surface. Also, it is different from the related art shown in FIG. 1 in an aspect in which the insulation film 39 is a film which does not allow the positive holes to pass there-through while an electron injection preventing film 205 is a film which allows the positive holes to pass there-through.

The photodiode 33 consists of the p+ layer 35, the n type region 34 and the high resistance substrate region 42 at the lower portion thereof. In a pixel structure of a rear-surface light receiving type having such a constitution, in a case when the thickness of the high resistance substrate 42 is thin, a depletion layer spreads from the n type region 34 of the photodiode 33 beyond the rear surface, so that it is possible to collect a large majority of electrons onto the nearest photodiode. Alternatively, in a case when the specification of the mixed color is loose, it is possible to make the thickness of the high resistance substrate 42 thick.

The insulation film 39 is provided on the rear surface of the silicon substrate 31, and an operation effect according to a matter of accumulating positive holes on the silicon boundary surface of the substrate rear surface side by applying a negative voltage with respect to the potential of the silicon substrate 31 to the aforesaid insulation film 39 is the same as in a case of the first or the second exemplified embodiment.

Next, the invention will be explained with respect to a desirable shape of the p well region 43 in the pixel structure of the rear-surface light receiving type relating to the third exemplified embodiment.

Figure 7:
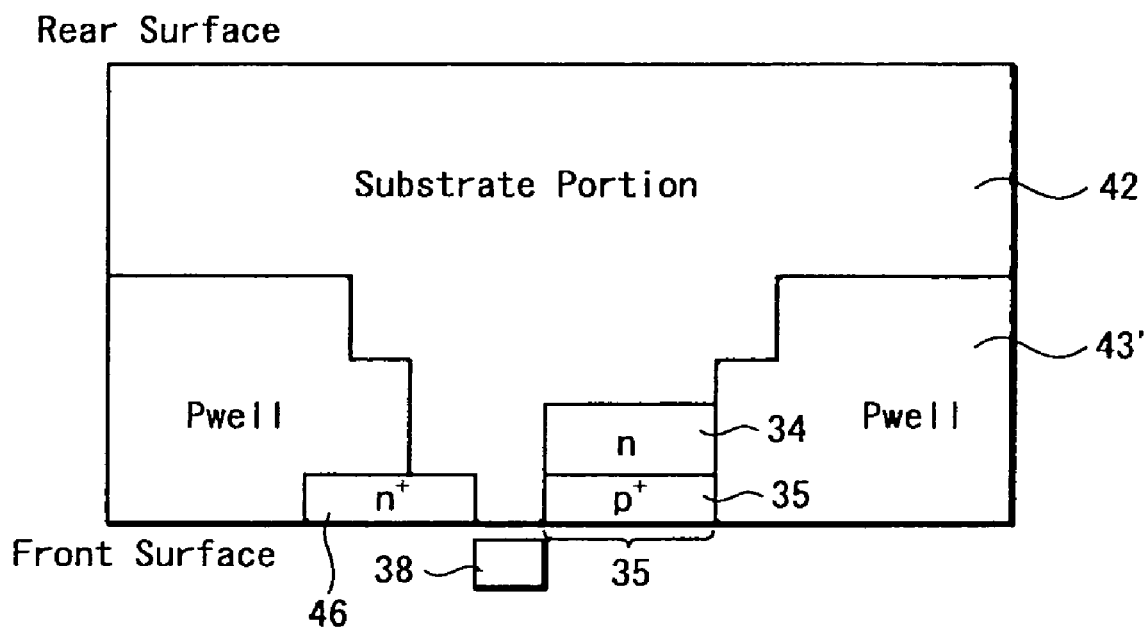
FIG. 7 is an enlarged diagram of a main portion showing a desirable embodiment of a p well region.

As a desirable embodiment of the p well region 43', the opening on the substrate rear surface side, is made to be larger than the opening on the substrate front surface side as shown in FIG. 7. In this manner, by making the opening on the substrate rear surface side of the p well region 43' in the pixel structure in which the p well region 43' does not reach the substrate rear surface to be large, there is a merit in which the photoelectron photoelectrically converted by the high resistance substrate 42 is easily collected in the n type region 34.

For a production method of the p well region 43' having such a shape, for example, when the formation is carried out by striking ions separately in different depths by a multiple number of ion injections, it is possible to use a method of formation by another process in which the ion injection in a deep portion is carried out by using another mask.

Fourth Exemplified Embodiment

Figure 8:
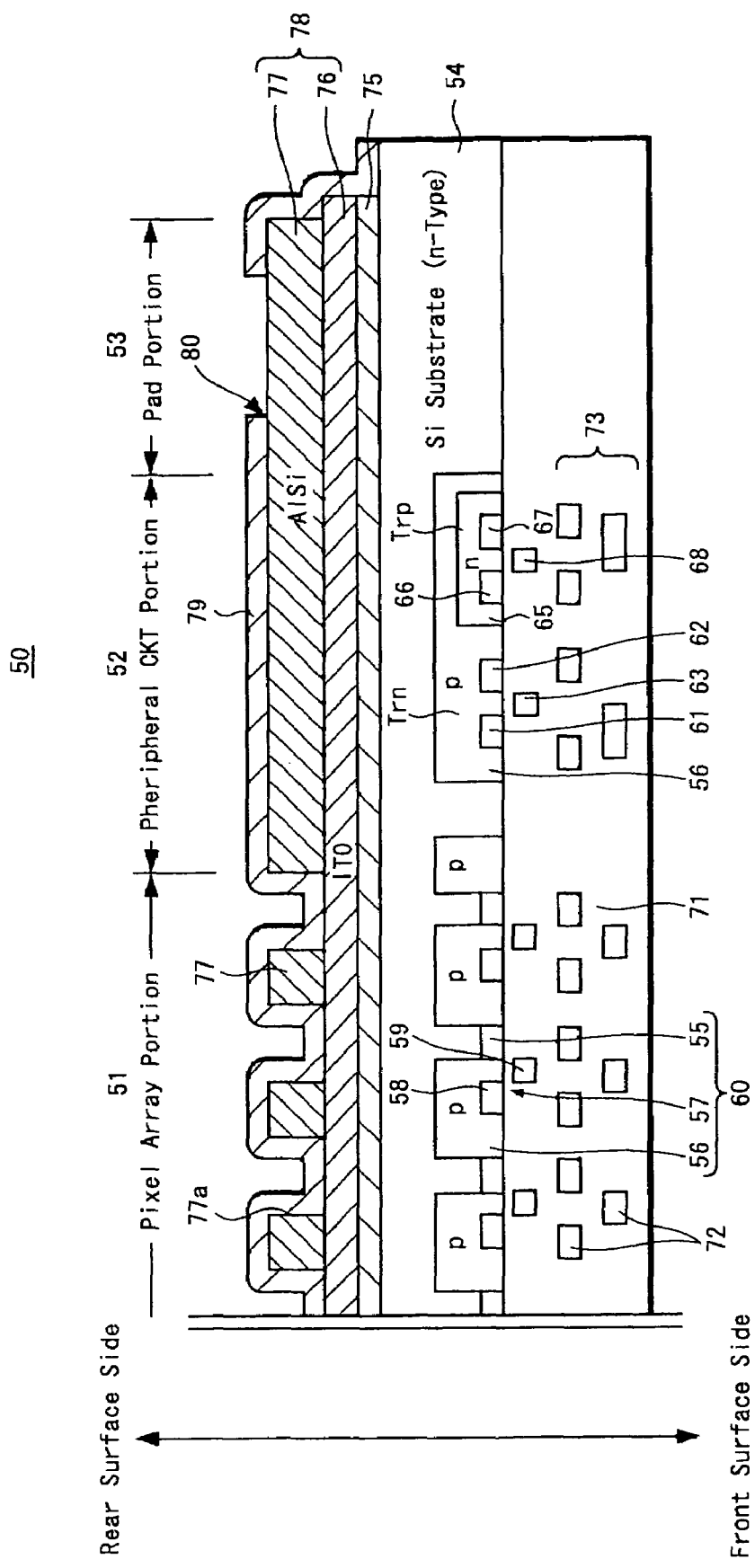
FIG. 8 is a cross section diagram showing a main portion of a solid-state imager device relating to a fourth exemplified embodiment of the present invention.

FIG. 8 is a cross section diagram showing a main portion of a CMOS imager sensor of a rear surface incidence type, more specifically, a pixel array portion, a peripheral circuit portion and a pad portion for bonding relating to a fourth exemplified embodiment of the present invention. A CMOS type image sensor 50 of this exemplified embodiment, as shown in FIG. 8, is formed in a pixel array portion 51 of a semiconductor substrate of a first conductivity type, for example, a n type silicon substrate 54, according to a two-dimensional arrangement of a plurality of (many of) pixels 60 in a matrix form, each of which (corresponding to pixel 11 of FIG. 3) is constituted by a photodiode 55 which becomes a photoelectric conversion element (corresponding to photodiode 111 of FIG. 4) and a plurality of MOS transistors provided in a p type well region 56. The MOS transistors are formed on the front surface side of the silicon substrate 54, and in FIG. 8 only a transfer transistor 57 (corresponding to transfer transistor 112 of FIG. 4) is shown as the MOS transistors. The transfer transistor 57 is formed by being provided with the photodiode 55 as a source, a n type source-drain region 58 which becomes a FD portion and a gate electrode 59 formed through a gate insulation film.

Also, in a peripheral circuit 52 of the silicon substrate 54, CMOS transistors are formed. More specifically, a n channel MOS transistor Trn consisting of n type source-drain regions 61 and 62 and a gate electrode 63 formed through a gate insulation film is formed in the p type well region 56, and a p channel MOS transistor Trp consisting of p type source-drain regions 66 and 67 and a gate electrode 68 formed through a gate insulation film is formed in a n type well region 65 in the p type well region 56.

A wiring layer 73 formed with multi-layer wirings 72 through interlayer insulation films 71 is formed on the front surface side of the silicon substrate 54 formed with the pixel 60 including the photodiode 55.

On the other hand, a transparent electrode (for example, ITO film: oxide of indium and tin) 76 is formed through a insulation film 75 approximately over the whole surface including from the pixel array portion 51 to the peripheral circuit portion 52 and periphery forming the pad portion 53 on the rear surface side of the silicon substrate 54, and there is formed, on the transparent electrode 76, a metal film which becomes a light shield film (light shielding electrode), for example, an AlSi film 77 excluding the portion corresponding to the photodiode 55. A rear surface electrode 78 of a two-layer structure is formed by the transparent electrode 76 and the AlSi film 77, which becomes a light shield film. Further, a passivation film 79 for protection is formed on the surface of the rear surface. The passivation film 79 is removed partially and selectively on the peripheral portion of the rear surface side of the silicon substrate 54, and the pad portion (so-called, bonding pad portion) 53 in which the AlSi film 77 is exposed from an opening 80 of the passivation film 79 is formed. The pad portion 53 is applied with a necessary negative voltage in a case when the signal charges of the photodiode 55 are electrons as described above.

In a case when the signal charges of the photodiode are electrons, the purpose of the rear surface electrode 78 is to induce carriers (positive holes) for repressing the generation of the dark current on the boundary surface of the substrate rear surface by applying a negative voltage to the rear surface electrode of the pixel array portion 51 and to light shield unnecessary portions. The transparent electrode 76 exists on the whole surface at the pixel array portion, but the metal film 77 is formed so as to be a grid-shape such that only the portion of the photoelectric conversion element (photodiode) 55 is formed with an opening. The light shielding portion of the pixel portion and the peripheral circuit thereof are covered by a rear surface electrode including a metal film, and it is constituted such that the light cannot enter.

The pad portion 53 is a portion for obtaining a physical interface with surroundings, and on an occasion of inspection, the pad portion 53 is applied with a needle of an inspection apparatus so as to be applied with a voltage, and on an occasion of mounting, wire bonding is carried out to this pad portion.

The silicon substrate 54 is formed to a necessary thickness by, for example, being polished according to CMP (Chemical Mechanical Polishing). It is preferable for the thickness of the silicon substrate 54 to be around 5 μm to 10 μm with respect to the visible light. By setting to this thickness, it is possible to photoelectrically convert the visible light by the photodiode 55 favorably.

The photodiode 55 is a buried diode (HAD: Hole Accumulated Diode) in which a n-region of a low density by the silicon substrate 54 becomes a photoelectric conversion region and which includes a n region of a high density for accumulating the photoelectrically converted light charges (electrons in this example) and further includes a p+ region (so-called p+ accumulation layer) for accumulating carriers (positive holes in this example) on the silicon boundary surface of the substrate front surface side.

The p type well region 56 is applied with a reference potential, for example, a ground (GND) potential by way of the wiring 72, specifically, the p well wiring 24 (see FIG. 4). The reset transistor 113, the amplifier transistor 114 and the selection transistor 115 for the pixel 60 (see FIG. 4) are formed on the p type well region 56.

The insulation film 75 on the substrate rear surface has, for example, a one-layer structure of a silicon oxide film (SiO2). However, the insulation film is not limited 75 by a one-layer structure of the silicon oxide film, and it may be of a structure having a plurality of layers by, for example, a silicon oxide film and a silicon nitride film. When the structure having a plurality of layers is employed, a reflection preventing effect owing to the silicon nitride film is obtained by selecting the thickness of each layer properly, and it is possible to take in the incident light more, so that it is possible to improve the sensitivity.

It is possible for the negative voltage applied to the light shield film 77 by AlSi and the transparent electrode 76 by way of the pad portion 53 to be set always, for example, 3V.

As mentioned above, by providing the insulation film 75 on the rear surface of the silicon substrate 54 and at the same time by applying a voltage of the same polarity with the signal charge of the photodiode 45 on the insulation film 75, for example, a negative voltage of around −3V, positive holes are induced on the silicon boundary surface of the substrate rear surface side and this becomes equivalent to a state in which a positive hole accumulation layer (so-called p+ accumulation layer) exists on the silicon boundary surface. At that time, the silicon substrate 54 and the transparent electrode 76 are insulated electrically by means of the insulation film 75, so that an electric field fundamentally in the p well region 56 which is not depleted is not formed. Then, as described above, according to the operation of the silicon boundary surface accumulated with the positive holes, electron generation from the silicon boundary surface on the substrate rear surface side, which is a dominant reason for generation of the dark current, will decrease.

Figure 9:
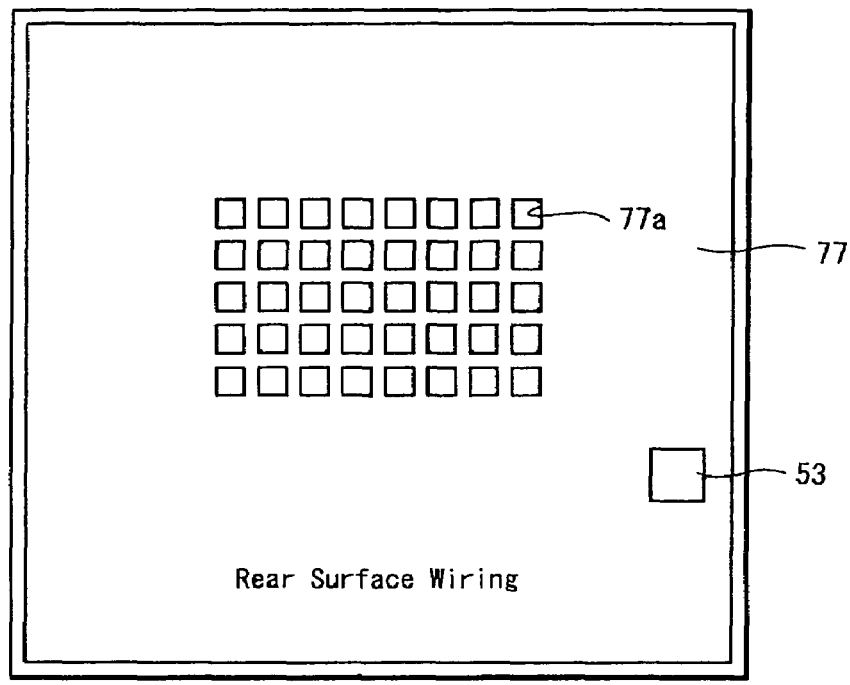
FIG. 9 is a plain view seen from the substrate rear surface side showing one example of how to take out a pad portion in a solid-state imager device relating to the present invention.
Figure 10:
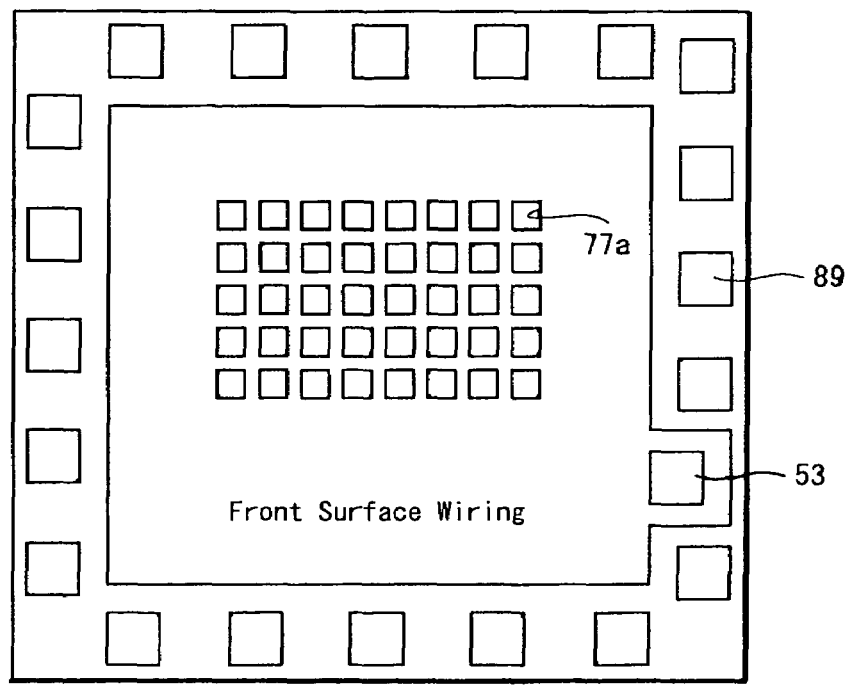
FIG. 10 is a plain view seen from the substrate rear surface side showing another example of how to take out a pad portion in a solid-state imager device relating to the present invention.

Since a rear surface incidence type is employed, the circuits of the main portion including the pixel array portion 51 are formed on the front surface side of the silicon substrate 54. The rear surface electrode 78 of a two-layer structure may include the transparent electrode 76 and the AlSi film 77 which is the light shield film are formed on the rear surface side, FIG. 9 shows an outlined plain view of. It is constituted such that light passes through the portion corresponding to the pixel photodiode by way of at least an opening 77a of the AlSi film 77 which is a light shield film in the rear surface electrode 78 and other portions are covered and also light shielded concurrently thereby. However, the opening of the AlSi film 77 is not formed in a light shielding pixel for level detecting when it is dark or the like. The pad portion 53 for applying a voltage to the AlSi film 77 is formed, such as mentioned above, by hollowing the passivation film 79 on the AlSi film 77. In the example of FIG. 9, the pad portion of the wiring 72 on the front side is formed on the front side. With respect to the forming of the pad portion, it is also possible, as shown in FIG. 10, to form the pad portion 53 of the rear surface electrode 78 on the rear surface side and at the same time to form a pad portion 89 for wiring on the front side so as to be derived to the rear surface side passing through the silicon substrate 54.

In this manner, it is possible for the CMOS imager sensor 50 of the rear surface incidence type in FIG. 8 to fabricate a structure equivalent to a positive hole accumulation layer on the silicon boundary surface of the substrate rear surface side, so that it is possible to decrease the dark current generation from the boundary surface of the substrate rear surface side. In particular, the process such as for ion injecting to the substrate rear surface side, for condensing the density or for applying heat treatment for activation in the related art becomes unnecessary, so that the production process is very easy and it is possible to make the blue sensitivity to be the maximum since the distribution of the formed positive hole accumulation layer in the substrate depth direction is very shallow.

The CMOS imager sensor 50 of the rear surface incidence type relating to the fourth exemplified embodiment mentioned above is a fundamental form, but even in a case when a needle of an inspection apparatus is applied with respect to the pad portion 53 so as to inspect thereof or wire bonding is carried out, it is necessary to certainly block the leakage current generation caused by a phenomenon in which the rear surface electrode (transparent electrode 76 and AlSi film 77 which becomes light shield film) and the silicon substrate 54 are short-circuited after the insulation film 75 is damaged.

The rear surface electrode 78 only applies a voltage and it is assumed that a steady-state current does not flow, but in a case when there is fear that a leakage current flows, it is necessary to block it certainly. When the leakage current flows, inconvenience occurs in which the substrate voltage may become unstable or electric power may be consumed even in a standby state, so that the yield is to go down.

It is contemplated for the generation reason of the leakage current such that since the thickness of the insulation film 75 on the substrate rear surface is equal to or more than around 100 nm, the insulation film 75 may be destroyed by applying a needle for inspection to the pad portion 53 many times or depending on how to carry out the bonding and thereafter, the rear surface electrode 78 and the silicon substrate 54 is short-circuited electrically. However, if the insulation film 75 is made to be thicker, the voltage to be applied to the rear surface electrode 78 must be increased.

Next, there is shown an exemplified embodiment in which the above matter is improved and the leakage current at the pad portion can be inhibited by limiting the voltage applied to the rear surface electrode 78 to a low level.

Fifth Exemplified Embodiment

Figure 11:
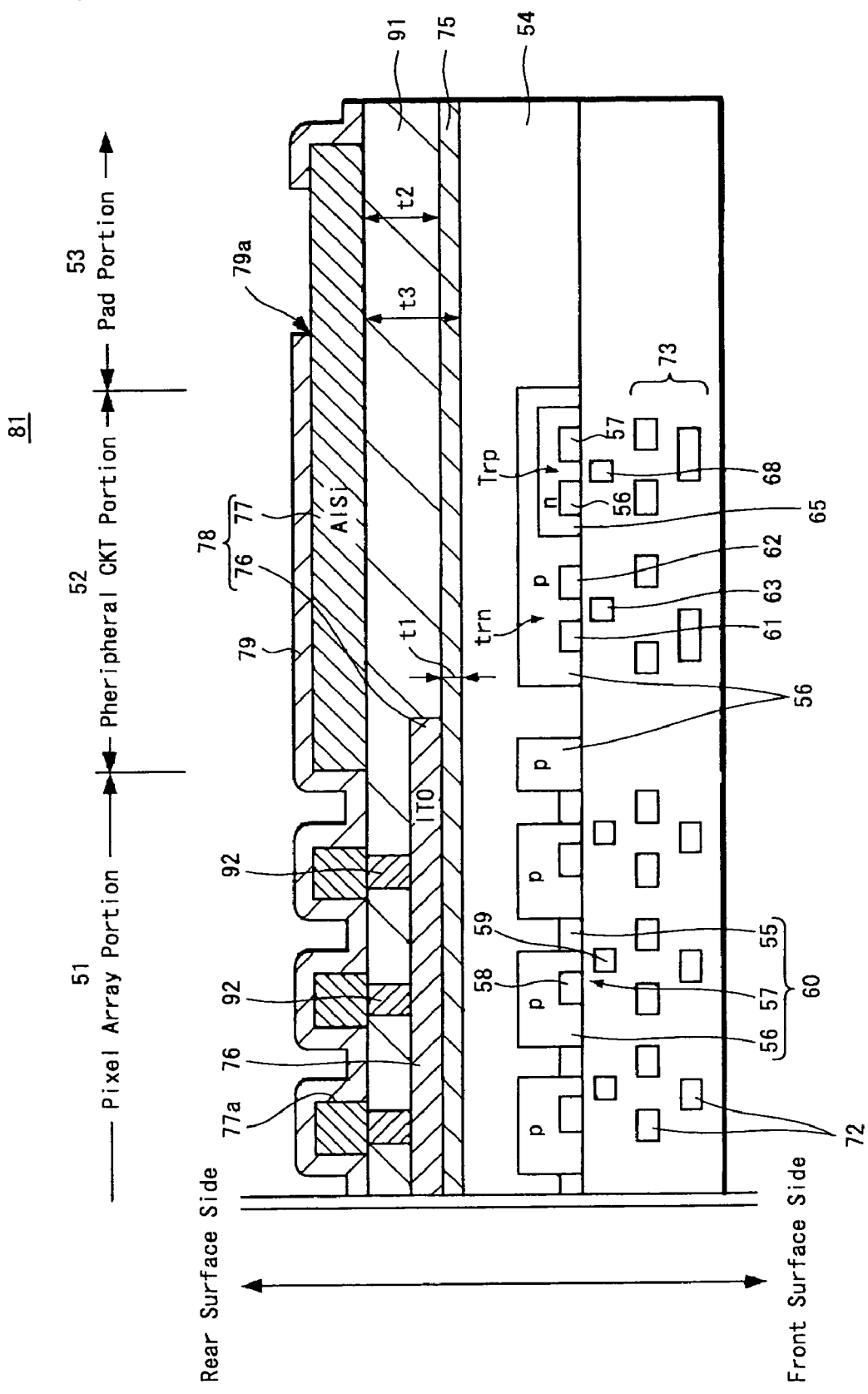
FIG. 11 is a cross section diagram showing a main portion of a solid-state imager device relating to a fifth exemplified embodiment of the present invention.

FIG. 11 is a cross section diagram showing a main portion (similar portion as the fourth exemplified embodiment) in a CMOS imager sensor of a rear surface incidence type of a fifth exemplified embodiment relating to aforesaid improvement. It should be noted in FIG. 11 that the same reference numerals are put for the portions corresponding to those in FIG. 8 and repetitive explanations thereof will be omitted. A CMOS image sensor 81 of this exemplified embodiment, similar as mentioned above, is formed in a pixel array portion 51 of a semiconductor substrate of a first conductivity type, for example, in the n type silicon substrate 54 according to a two-dimensional arrangement of a plurality of (many of) pixels 60 in a matrix form, each of which consists of a photodiode 55 which becomes a photoelectric conversion element and a plurality of MOS transistors on the substrate surface side, a multi-layer wiring layer 73 is formed on the substrate front surface and a rear surface electrode 78 consisting of a two-layer structure consisting of a transparent electrode (for example, ITO film) 76 and a metal film which becomes a light shield film, for example, an AlSi film 77 is formed through the insulation film 75 on the substrate rear surface.

Then, in this exemplified embodiment, in particular, the transparent electrode 76 is formed by being limited in the region of the pixel array portion 51, an interlayer insulation film 91 is formed on the whole surface of the substrate rear surface side including the upper portion of the transparent electrode 76 and the AlSi film 77 which becomes a light shield film is formed on the interlayer insulation film 91. The AlSi film 77 is formed in a grid-shape in the pixel array portion 51 excluding the region corresponding to the photodiode 55. Then, in the pixel array portion 51, the AlSi film 77 and the transparent electrode 76 are connected electrically by way of contact portions 92 provided at a plurality of portions of the interlayer insulation film 91, preferably at four portions interleaving respective openings of the AlSi film. Further, the pixel array portion 51 of the substrate rear surface and the peripheral circuit portion 52 are included and at the same time, the passivation film 79 is formed on the whole surface excluding the pad portion 53. Here, it is possible to form the interlayer insulation film 91 by, for example, a silicon oxide film, a silicon nitride film or the like. The interlayer insulation film 91 just under the pad portion 53 becomes a leakage current inhibiting region. It is preferable to make the film thickness t1 of the insulation film 75 to be as thin as possible if the electrical insulation ability between the silicon substrate 54 and the transparent electrode 76 can be maintained and it is possible, for example, to make it to be equal to or more than 60 nm. Also, it is enough to make the film thickness t2 of the interlayer insulation film 91 just under the pad portion 53 to be a film thickness of such a degree in which even if an inspection needle is applied to the pad portion 53, an insulation breakdown with respect to the silicon substrate 54 is avoided and the leakage current will not be generated. For example, it is possible to make a summed thickness t3 of the insulation film 75 and the interlayer insulation film 91 from the AlSi film 77 to the silicon substrate 54 in the pad portion 53 to be, for example, equal to or more than 100 nm and preferably to be around 150 nm to 800 nm. The side in which t3 is thick is decided in a range in which the production process thereof is easy and light focusing of oblique incident light there-through is easy. For example, it is possible to make t3 to be several hundred nano-meters. The constitutions other than the above are similar to those in FIG. 8.

Next, a manufacturing method of the CMOS imager sensor 81 relating to the fifth exemplified embodiment in FIG. 11 will be explained. Here, it will be shown within the production processes about processing the portions of the respective films 75, 76, 77, 91 and 79 on the substrate rear surface relating to this exemplified embodiment.

First, the insulation film 75 of the rear surface side, for example, a silicon oxide film (SiO2) is formed on the whole surface of the rear surface of the silicon substrate 54 by means of a CVD method or a low temperature oxidation method.

Next, the transparent electrode 76, for example, an ITO film is formed on the whole surface of the insulation film 75 by means of a sputtering method.

Next, the transparent electrode 76 is removed selectively by means of wet etching and it is remained only on the pixel array portion 51.

Next, annealing is carried out in order to adjust the characteristic of the transparent electrode 76.

Next, the interlayer insulation film 91 is formed on the whole surface. For example, the interlayer insulation film 91 is formed by a CVD oxide film which is formed by means of a low pressure CVD method using organic silane (TEOS).

Next, a contact hole is formed in the interlayer insulation film 91 of the pixel array portion 51.

Next, a contact portion by a conductive material is embedded in the contact hole.

Next, a metal film which becomes a light shield film, for example, the AlSi film 77 is formed on the whole surface by means of a sputtering method.

Next, an opening is formed at a portion corresponding to the photodiode 45 in the pixel array portion 55 by etching the AlSi film 77 selectively.

Next, the passivation film 79, for example, a silicon nitride film (SiN) is formed on the whole surface.

Next, an opening 79a is formed at a portion corresponding to the pad portion 53 by etching the passivation film 79 selectively so as to expose the AlSi film 77 and the pad portion 53 is formed.

Figure 12:
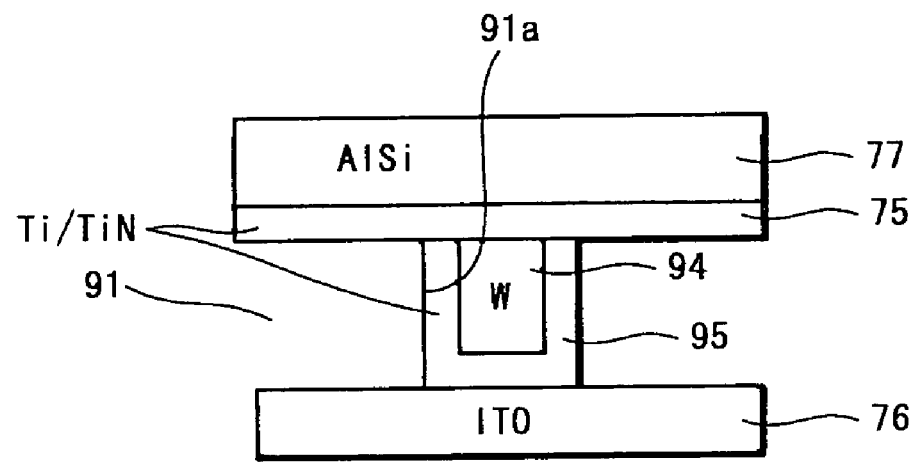
FIG. 12 is a cross section diagram showing one example of a contact portion in a rear surface electrode of a two-layer structure applied in the present invention.
Figure 13:
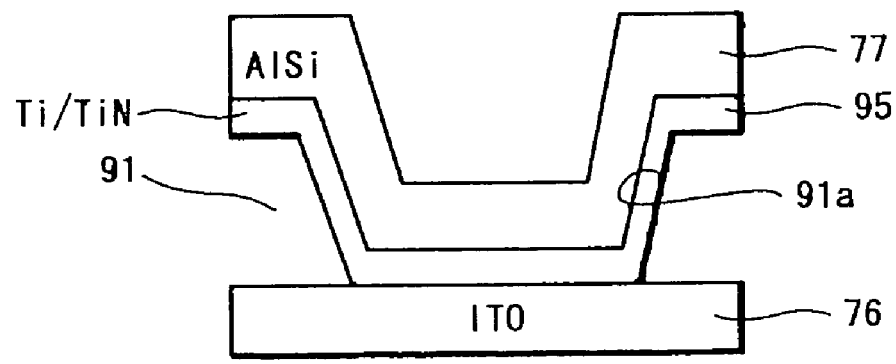
FIG. 13 is a cross section diagram showing another example of a contact portion in a rear surface electrode of a two-layer structure applied to the present invention.

With respect to the contact embedding, for example, as shown in FIG. 12, it is possible to use a method in which an ordinary tungsten (W) layer 94 is embedded in a contact hole 91a of the interlayer insulation film 91. In this case, it is preferable to insert a Ti/TiN film 95 as a barrier metal for adhesion and contact resistance lowering between the tungsten layer 94 and the transparent electrode 76 and between the AlSi layer 77 and the interlayer insulation film 91. When the aspect ratio of the contact hole 91a is small, the contact embedding process is omitted and, as shown in FIG. 13, it is preferable to form the AlSi film 77 in such a manner that it is embedded into the contact hole 91a directly by means of a sputtering method. In this case, it is also preferable to interleave the Ti/TiN film 95 which becomes a barrier metal in order to lower the adhesion and the contact resistance.

It is possible to maintain the transparent electrode (for example, ITO film) 76 approximately on the whole surface such as mentioned above with respect to FIG. 8, but it is constituted in this example such that it is maintained only in the vicinity of the pixel array portion 51. In a case when the transparent electrode 76 exists approximately on the whole surface and a negative voltage is applied thereto, parasitic MOS transistors operate in other portions than the pixel array portion 51 and it sometimes happens, for example, that an inconvenience occurs in which leakage is caused between p wells of different potentials or the like. It is possible to prevent the conduction of aforesaid parasitic MOS transistors by maintaining the transparent electrode 76 on the side close to the Si substrate only on the pixel array portion 51 and on the vicinity thereof and by light shielding the peripheral circuit portion by the AlSi layer 77 far away from the Si substrate through the interlayer film 91. In this case, it is generally contemplated that etching of the AlSi layer 77 becomes difficult owing to a fact that a step of around several dozen nano-meters occurs also on the interlayer insulation film 91 at the boundary between a place in which the transparent electrode 76 exists in an under-layer and a place in which it does exists therein, but the step is small and the etching of the AlSi film 77 is carried out on the thick interlayer insulation film 91, so that it becomes possible to carry out the process by increasing over etching. It is needless to say that a glamorization process of the interlayer insulation film 91 can be inserted.

In FIG. 8 mentioned above, the insulation film 75 does not exist on the outer circumference farer than the transparent electrode 76, but in the fifth exemplified embodiment of FIG. 11, the insulation film 75 exists beyond the outer circumference of the transparent electrode 76. The peripheral insulation film 75 also disappears by over etching when etching the AlSi film 77 in the fourth exemplified embodiment of FIG. 8, but a thick interlayer insulation film exists in the fifth exemplified embodiment of FIG. 11, so that it never happens that the peripheral insulation film 75 is to be etched until the silicon substrate 54. Incidentally, it becomes possible in the etching of the transparent electrode 76 to carry out selective etching by means of wet etching almost without trimming the insulation film 75.

It is also possible to form a color filter or an on-chip lens above the rear surface electrode 78. It is constituted in the fifth exemplified embodiment of FIG. 11 such that the opening of the AlSi film 77 is formed for every one pixel and the contact is formed for one pixel by one pixel of the pixel array portion 51, but it may be constituted in another way, for example, such that the whole of the pixel array portion 51 is made to be an opening of the AlSi film and the contact is carried out at the periphery of the pixel array portion 51.

According to the fifth exemplified embodiment, it is possible to form the insulation film 75 of the pixel array portion 51 thinly, so that it is possible to apply a rear surface voltage to the rear surface electrode 78 by a low voltage with respect to the pixel 55. More specifically, it is possible to induce such a degree of positive holes which can inhibit the dark current generation on the silicon boundary surface of the substrate rear surface by a low voltage. Furthermore, there exists the thick interlayer insulation film 91 under the pad portion 53, so that it is possible to protect it from the insulation breakdown. Although not shown in FIG. 11, it is also possible to fabricate a circuit on the front surface side under the pad portion 53.

Sixth Exemplified Embodiment

In the fifth exemplified embodiment, the AlSi film 77 is formed at a position far from the silicon substrate 54. In this case, if the opening 77a is formed for every one pixel on the AlSi film 77, it becomes away from the silicon substrate 54 as much as the thickness of the interlayer insulation film 91, so that the vignetting of the oblique light at the opening 77a is influenced and it becomes disadvantageous for the light focusing. Next, it will be explained with respect to a sixth exemplified embodiment in which the above matter is improved.

Figure 14:
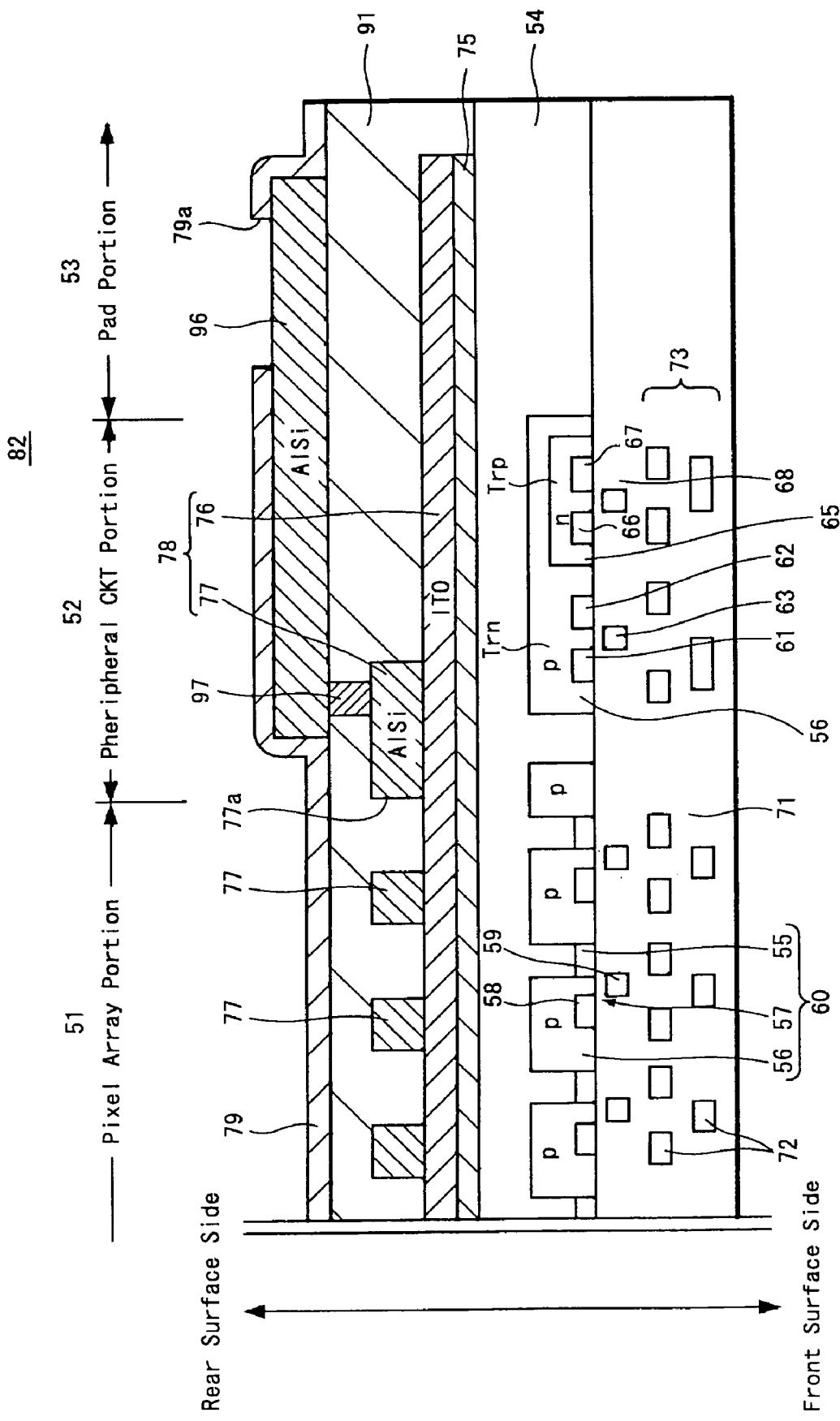
FIG. 14 is a cross section diagram showing a main portion of a solid-state imager device relating to a sixth exemplified embodiment of the present invention.

FIG. 14 is a cross section diagram showing a main portion (similar portion as the fourth exemplified embodiment) in a CMOS imager sensor of a rear surface incidence type relating to a sixth exemplified embodiment. It should be noted in FIG. 14 that the same reference numerals are put for the portions corresponding to those in FIG. 8 and repetitive explanations thereof will be omitted. A CMOS image sensor 82 of this exemplified embodiment, similar as mentioned above, is formed in a pixel array portion 51 of a semiconductor substrate of a first conductivity type, for example, in the n type silicon substrate 54 according to a two-dimensional arrangement of a plurality of (many of) pixels 60 in a matrix form, each of which consists of a photodiode 55 which becomes a photoelectric conversion element and a plurality of MOS transistors (in the drawing, only the transfer transistor 57 is shown) on the substrate surface side, a multi-layer wiring layer 73 is formed on the substrate front surface and a rear surface electrode 78 consisting of a two-layer structure consisting of a transparent electrode (for example, ITO film) 76 and a metal film which becomes a light shield film, for example, an AlSi film 77 is formed through the insulation film 75 on the substrate rear surface.

Then, in this exemplified embodiment, in particular, the transparent electrode 76 is formed approximately over the whole surface of the substrate rear surface and at the same time, the AlSi film 77 which becomes a light shield film is formed only in the region corresponding to the pixel array portion 51 and furthermore by being directly in piles with the transparent electrode 76. The opening 77a is formed for every one pixel on that AlSi film 77. Subsequently, the interlayer insulation film 91 is formed on the whole surface and a film which becomes a light shield film of a second layer, for example, an AlSi film 96 is formed only in the region of the peripheral circuit portion 52 on the interlayer insulation film 91 and the pad portion 53. The AlSi film 96 of the second layer and the AlSi film 77 of the first layer are connected at the periphery of the pixel array portion 51 through a contact portion 97. The interlayer insulation film 91 is formed so as to contact with the substrate rear surface at the outer circumference surrounding the insulation film 75 and the transparent electrode 76. Further, the passivation film 79 is formed on the whole surface and the opening 79a is formed at a portion corresponding to the pad portion 53 by etching the passivation film 79 selectively so as to expose the AlSi film 77 and the pad portion 53 is formed. The interlayer insulation film 91 just under the pad portion 53 becomes a leakage current inhibiting region. The constitutions other than the above are similar to those in FIG. 11.

According to the sixth exemplified embodiment, the distance between the AlSi film 77 which becomes a light shield film and the silicon substrate 54 in the pixel array portion 51 becomes smaller than the case of FIG. 11, so that it becomes advantageous for the light focusing to the photodiode 55. For other matters, similarly as explained in FIG. 11, it is possible to prevent the insulation breakdown in the pad portion 53 and to inhibit the leakage current generation while the rear surface voltage applied to the rear surface electrode 78 is limited within a low level.

Seventh Exemplified Embodiment

Figure 15:
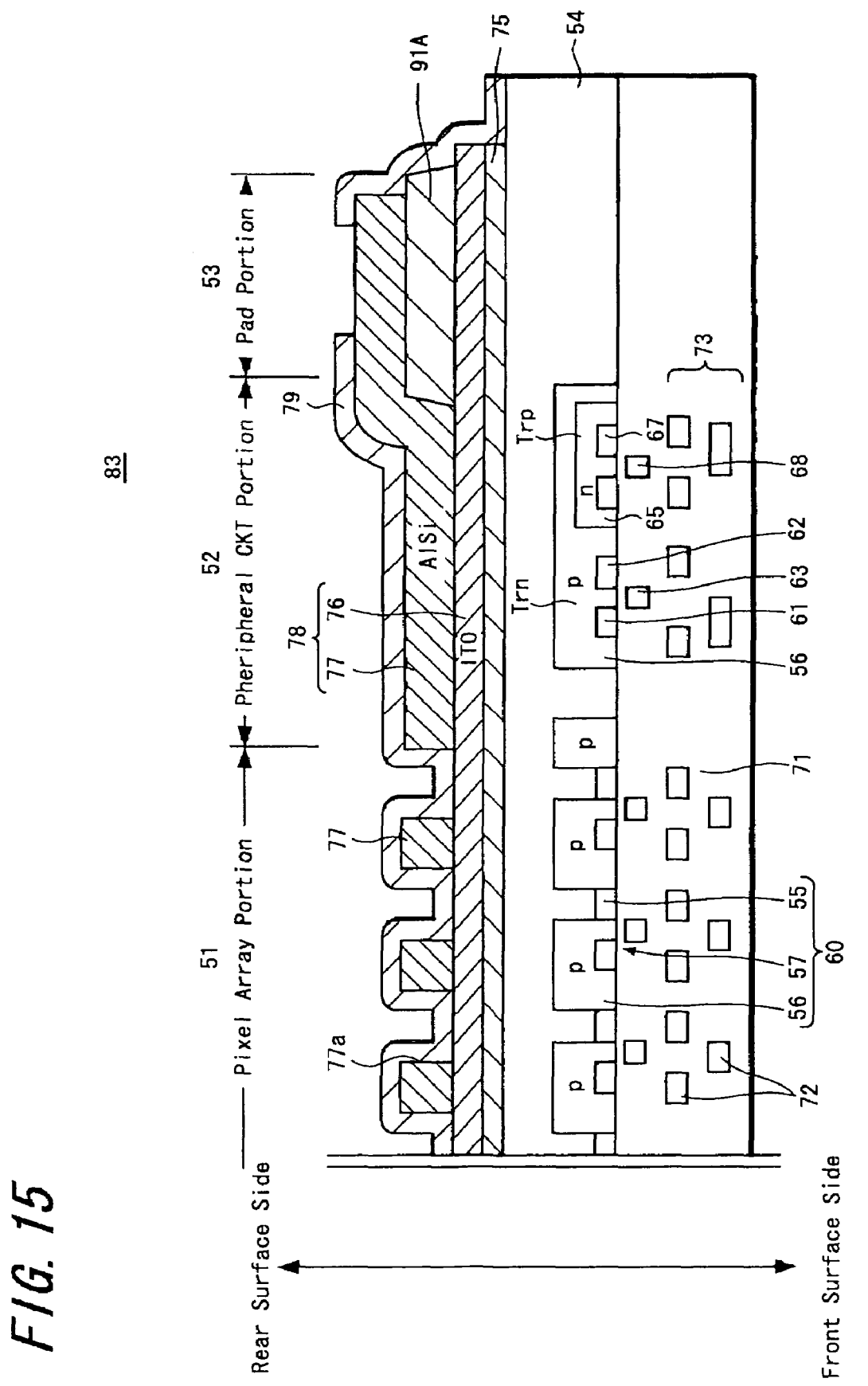
FIG. 15 is a cross section diagram showing a main portion of a solid-state imager device relating to a seventh exemplified embodiment of the present invention.

FIG. 15 is a cross section diagram showing a main portion (similar portion as the fourth exemplified embodiment) in a CMOS imager sensor of a rear surface incidence type relating to a seventh exemplified embodiment. It should be noted in FIG. 15 that the same reference numerals are put for the portions corresponding to those in FIG. 8 and repetitive explanations thereof will be omitted. A CMOS image sensor 83 of the rear surface incidence type according to this exemplified embodiment, similar as mentioned above, is formed in a pixel array portion 51 of a semiconductor substrate of a first conductivity type, for example, in the n type silicon substrate 54 according to a two-dimensional arrangement of a plurality of (many of) pixels 60 in a matrix form, each of which consists of a photodiode 55 which becomes a photoelectric conversion element and a plurality of MOS transistors (in the drawing, only the transfer transistor 57 is shown) on the substrate surface side, a multi-layer wiring layer 73 is formed on the substrate front surface and a rear surface electrode 78 consisting of a two-layer structure consisting of a transparent electrode (for example, ITO film) 76 and a metal film which becomes a light shield film, for example, an AlSi film 77 is formed through the insulation film 75 on the substrate rear surface.

Then, in this exemplified embodiment, the transparent electrode 76 is formed approximately over the whole surface of the substrate rear surface and at the same time, an interlayer insulation film, that is, an interlayer insulation film 91A which becomes a cushion is formed limited by in the position corresponding to the pad portion 53 on the transparent electrode 76. A metal film which becomes a light shield film, for example, the AlSi film 77 is formed so as to run on this interlayer insulation film 91A approximately on the whole surface including the pixel array portion 51 and the peripheral circuit portion 52. Further, the passivation film 79 is formed on the whole surface, the AlSi film 77 is exposed by etching the passivation film 79 selectively so as to form the opening 79a at a portion corresponding to the pad portion 53 and the pad portion 53 is formed. The interlayer insulation film 91A just under the pad portion 53 becomes a leakage current inhibiting region. It is also contemplated that the interlayer insulation film 91A which becomes a cushion is to be formed between the transparent electrode 76 and the insulation film 75. However, the interlayer insulation film 91A is made to have a thickness equal to or more than 100 nm similarly as mentioned above, so that it is preferable to provide it on the transparent electrode 76 which plays a role of an etching stopper on an occasion of selective etching for the interlayer insulation film 91A. The constitutions other than the above are similar to those in FIG. 8.

According to the seventh exemplified embodiment, the interlayer insulation film 91A which becomes a cushion is formed only just under the pad portion 53, so that the pad portion 53 will have a far distance from the silicon substrate 54. On the other hand, in the pixel array portion 51, the AlSi film 77 which is a light shield film is formed directly on the transparent electrode 76, so that it becomes advantageous for the light focusing to the photodiode 55. Consequently, similarly as in the sixth exemplified embodiment, the light focusing efficiency to the photodiode is to be increased and at the same time, it is possible to prevent the insulation breakdown in the pad portion 53 and to inhibit the leakage current generation while the rear surface voltage applied to the rear surface electrode 78 is limited within a low level.

Here, a step equal to or more than 100 nm occurs at the periphery of the interlayer insulation film 91A which becomes a cushion, so that etching remainders are produced easily at step portion on an occasion of the selective etching of the AlSi film 77 but only by making the interlayer insulation film 91A of the cushion to be formed only on the pad portion 53, a short-circuit with other wirings never happens even if the etching remainder is produced. Alternatively, if the AlSi film 77 is made to cover the interlayer insulation film 91A, the etching remainder at the step portion is never produced primarily.

Eighth Exemplified Embodiment

Figure 16:
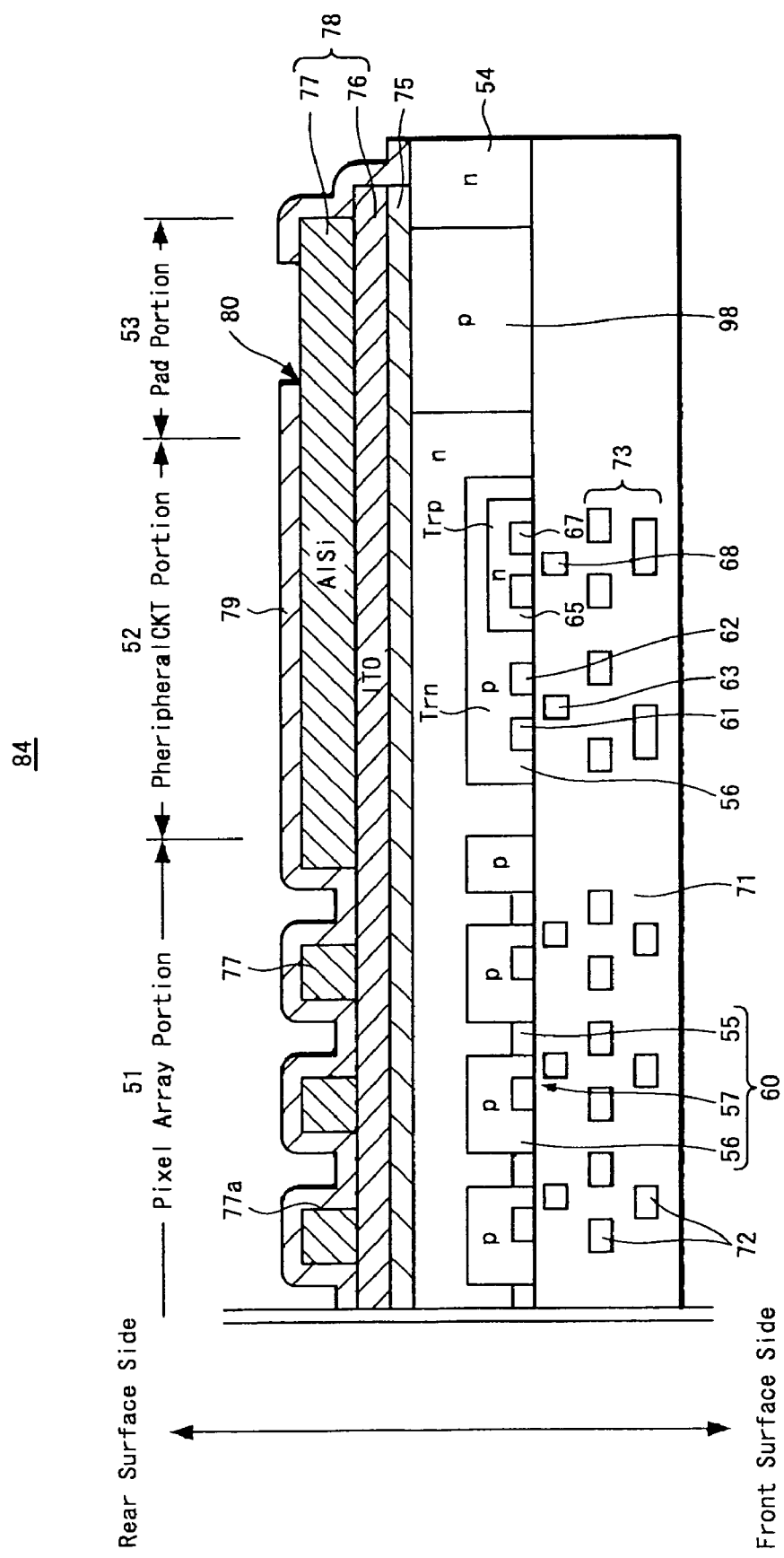
FIG. 16 is a cross section diagram showing a main portion of a solid-state imager device relating to an eighth exemplified embodiment of the present invention.

FIG. 16 is a cross section diagram showing a main portion (similar portion as the fourth exemplified embodiment) in a CMOS imager sensor of a rear surface incidence type relating to a eighth exemplified embodiment. It should be noted in FIG. 16 that the same reference numerals are put for the portions corresponding to those in FIG. 8 and repetitive explanations thereof will be omitted. A CMOS image sensor 84 according to this exemplified embodiment is constituted similarly as above mentioned FIG. 8 with respect to the rear surface electrode 78 of the two-layer structure on the substrate rear surface. More specifically, the transparent electrode (for example, ITO film) 76 and, for example, the AlSi film 77 which becomes a light shield film are laminated through the insulation film 75 on the substrate rear surface and an opening is formed at a portion corresponding to the photodiode 55 of the pixel array portion 51. Then, the passivation film 79 is formed on the whole surface excluding the pad portion 53.

In this exemplified embodiment, in particular, there is formed, in the silicon substrate 54 just under the pad portion 53, a semiconductor well region 98 which is floating electrically or has the same potential as that of the rear surface electrode 78 so as to be contacted with at least the substrate rear surface of the silicon substrate 54 and it is constituted such that this semiconductor well region 98 is surrounded by a semiconductor region of a reverse conductivity type which is made to be reverse biased with respect to the potential of the rear surface electrode 78. In the drawing, as the semiconductor well region 98, it is formed by a p type well region of a reverse conductivity type with respect to the n type silicon substrate 54. This p type well region 98 is formed from the rear surface of the silicon substrate 54 beyond the front surface thereof, but it may be constituted such that it is formed from the substrate rear surface until halfway in the substrate thickness direction without reaching the substrate front surface. The semiconductor well region 98 becomes a leakage current inhibiting region. The constitutions other than the above are similar to those in FIG. 8.

In the eighth exemplified embodiment, the n type silicon substrate 54 is applied with the power supply voltage and the rear surface electrode 78 is applied with a negative voltage. Consequently, even if the insulation film 75 under the pad portion 53 is destroyed and the pad portion 53 and the p type well region 98 are short-circuited, the negative voltage of the rear surface voltage is applied to the p type well region 98, so that the pn junction formed by the p type well region 98 and the n type silicon substrate 54 is reverse biased and almost no leakage current flows. Essentially, it should be constituted even if the insulation film 75 is destroyed such that the region on the side of the silicon substrate 54 short-circuited to the pad portion 53 is to be reverse biased with respect to the periphery so as to prevent the leakage current, so that it may be other substrate conductivity type or other semiconductor well structure than that of FIG. 16.

According to the eighth exemplified embodiment, it is possible to inhibit the leakage current by providing the semiconductor well region 98 which is electrically floating or reverse biased in the silicon substrate 54 just under the pad portion 53 even if the insulation film 75 is destroyed. At the same time, the thickness of the insulation film 75 can be made to be thin, so that it is possible to attempt low voltage making of the voltage applied to the rear surface electrode 78.

According to the fifth to the eighth exemplified embodiments mentioned above, it is possible in a CMOS imager sensor of a rear surface incidence type to prevent an insulation breakdown at the pad portion while the voltage applied to the rear surface electrode is limited in a low level or it is possible to inhibit a leakage current even if an insulation breakdown occurs.

In the above examples, a two-layer structure of the transparent electrode 76 and the light shield film (light shielding electrode) 77 was employed approximately on the whole surface of the rear surface of the silicon substrate 54 for the rear surface electrode 78, but it is possible to apply the structure under the pad portion mentioned above also to cases of other rear surface electrode structures. For example, in a case when the peripheral circuit portion 52 is formed by using all digital circuits and the light shielding is not necessary, it is enough if the light shield film 77 is formed only for the pixel array portion 51.

In each of the abovementioned embodiments, it was assumed that an n type substrate is to be used for the semiconductor substrate, but it is possible to constitute it by using a p type substrate. In this case, it is needless to say that it is possible to employ all reverse structures in each of the embodiments for n type and p type, electron and positive hole, and voltage polarities.

Figure 17:
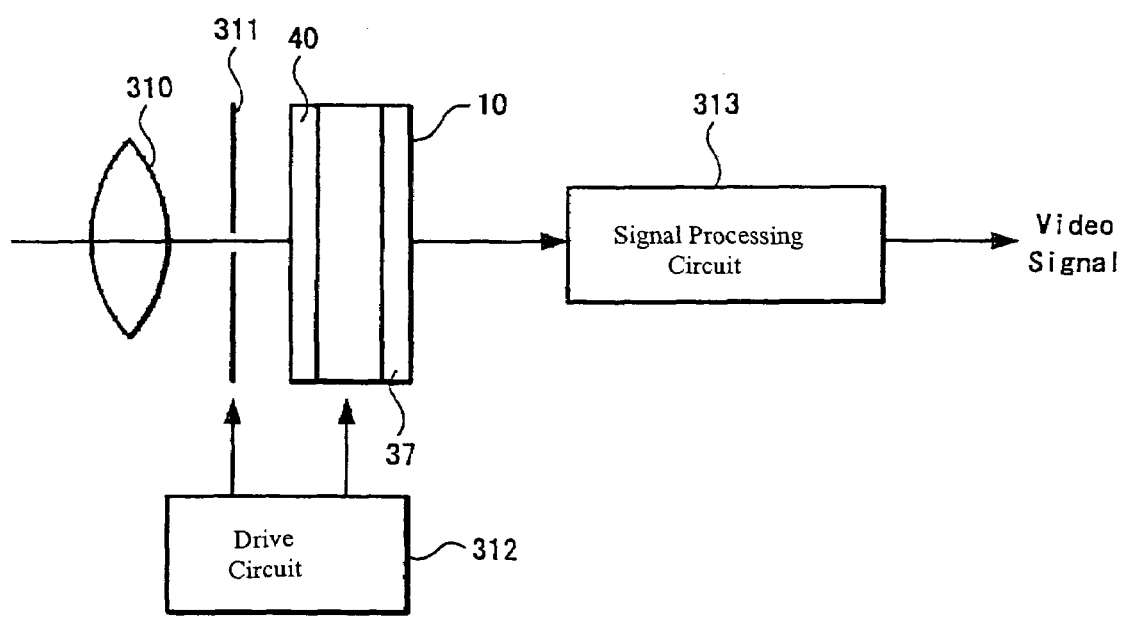
FIG. 17 is a cross section diagram of a camera apparatus relating to an exemplified embodiment of the present invention.

FIG. 17 shows a cross section diagram of a camera apparatus of an exemplified embodiment relating to the present invention. The camera apparatus relating to this exemplified embodiment is an example of a video camera apparatus capable of taking a moving picture.

The camera apparatus relating to this exemplified embodiment is provided with an image sensor 10, an optical system 310, a shutter device 311, a drive circuit 312 and a signal processing circuit 313.

The optical system 310 images image light (incident light) from a subject on the imager surface of the image sensor 10. Thus, aforesaid signal charges are accumulated in the image sensor 10 for a certain period.

The shutter device 311 controls the light irradiation period to the image sensor 10 and the light shielding period.

The drive circuit 312 supplies a drive signal for controlling the transfer operation of the image sensor 10 and the shutter operation of the shutter device 311. Charge transfer of the image sensor 10 is carried out according to the drive signal (timing signal) supplied from the drive circuit 312. The signal processing circuit 313 carries out various kinds of signal processes. The video signal applied with the signal process is stored in a recording medium such as a memory or outputted to a monitor.

A solid-state imager device and a camera apparatus relating to the present invention can be utilized as an imaging device of an imager apparatus such as a video camera apparatus, a digital still camera apparatus or the like and furthermore it can be utilized also as an imaging device of a mobile apparatus such as a mobile phone with a camera apparatus or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imager device, wherein
pixels including photoelectric conversion elements are formed on a semiconductor substrate;
incident light is made to be taken in from a rear surface side of said semiconductor substrate;
an insulation film is formed on said rear surface side;
a rear surface electrode is formed through said insulation film at least in the pixel array portion; and
there is provided under a pad portion of said rear surface electrode with a leakage current inhibiting region for inhibiting a leakage current between the pad portion and said semiconductor substrate,
wherein said rear surface electrode has a two-layer structure separated by an interlayer insulation film;
said two-layer structure is connected by a contact portion; and
said leakage current inhibiting region is formed by said interlayer insulation film under the pad portion of said rear surface electrode.

2. A solid-state imager device according to claim 1, wherein
said rear surface electrode has a two-layer structure;
an interlayer insulation film is inserted into said two-layer structure corresponding to the pad portion of said rear surface electrode; and
said leakage current inhibiting region is formed by said interlayer insulation film.

3. A solid-state imager device according to claim 1, wherein a semiconductor well region of a floating potential or of a potential same as that of said rear surface electrode is formed by being contacted with at least a rear surface of said semiconductor substrate under said pad portion;

said semiconductor well region is surrounded by a semiconductor region of a reverse conductivity type with that of said semiconductor well region which is to have a reverse bias with respect to the potential of said rear surface electrode; and said leakage current inhibiting region is formed by said semiconductor well region.

4. A solid-state imager device according to claim 1, wherein a layer on the side closer to the Si substrate in said two-layer structure is formed only in the vicinity of said pixel array portion.

* * * * *